(12) United States Patent
Wardle et al.

(10) Patent No.: US 12,319,579 B2
(45) Date of Patent: Jun. 3, 2025

(54) FORMATION AND/OR GROWTH OF CARBON-BASED NANOSTRUCTURES ON COPPER-CONTAINING SUBSTRATES, AND RELATED SYSTEMS AND METHODS

(71) Applicant: Massachusetts Institute of Technology, Cambridge, MA (US)

(72) Inventors: Brian L. Wardle, Lexington, MA (US); Luiz Acauan, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 966 days.

(21) Appl. No.: 17/413,175

(22) PCT Filed: Dec. 13, 2019

(86) PCT No.: PCT/US2019/066352
§ 371 (c)(1),
(2) Date: Jun. 11, 2021

(87) PCT Pub. No.: WO2020/124018
PCT Pub. Date: Jun. 18, 2020

(65) Prior Publication Data
US 2022/0041450 A1   Feb. 10, 2022

Related U.S. Application Data

(60) Provisional application No. 62/780,125, filed on Dec. 14, 2018.

(51) Int. Cl.
| | |
|---|---|
| *C01B 32/16* | (2017.01) |
| *C23C 16/02* | (2006.01) |
| *C23C 16/26* | (2006.01) |

(52) U.S. Cl.
CPC .......... *C01B 32/16* (2017.08); *C23C 16/0245* (2013.01); *C23C 16/0254* (2013.01); *C23C 16/26* (2013.01)

(58) Field of Classification Search
CPC . C23C 16/02; C23C 16/0227; C23C 16/0236; C23C 16/0245; C23C 16/0254
See application file for complete search history.

(56) References Cited

U.S. PATENT DOCUMENTS 9,150,418 B2 * 10/2015 Boyd ..................... B01J 19/088
9,663,368 B2   5/2017 Guzman de Villoria et al.
(Continued)

FOREIGN PATENT DOCUMENTS

JP   2004-284919 A   10/2004
JP   2005-279624 A   10/2005
(Continued)

OTHER PUBLICATIONS

Yan et al., ACS Nano 2012, 6 (10), 9110-9117.*
(Continued)

*Primary Examiner* — Vu A Nguyen
(74) *Attorney, Agent, or Firm* — Wolf, Greenfield & Sacks, P.C.

(57) ABSTRACT

Systems and methods for the formation and/or growth of elongated carbon-based nanostructures on copper-containing substrates, are generally described. Inventive articles comprising elongated carbon-based nanostructures and copper-containing substrates are also described.

20 Claims, 9 Drawing Sheets

(56) References Cited

U.S. PATENT DOCUMENTS

| | | | |
|---|---|---|---|
| 2005/0238810 A1* | 10/2005 | Scaringe | D01F 9/127 |
| | | | 427/249.1 |
| 2009/0117363 A1 | 5/2009 | Wardle et al. | |
| 2009/0297846 A1 | 12/2009 | Hata et al. | |
| 2010/0196695 A1 | 8/2010 | Garcia et al. | |
| 2010/0255303 A1 | 10/2010 | Wardle et al. | |
| 2010/0270069 A1 | 10/2010 | Shar et al. | |
| 2011/0162957 A1 | 7/2011 | Wardle et al. | |
| 2012/0164903 A1 | 6/2012 | Wardle et al. | |
| 2013/0142987 A1 | 6/2013 | Wardle et al. | |
| 2014/0126112 A1 | 5/2014 | Nguyen et al. | |
| 2014/0295098 A1 | 10/2014 | Shanov et al. | |
| 2014/0295166 A1 | 10/2014 | Steiner, III et al. | |
| 2015/0071849 A1 | 3/2015 | Steiner, III et al. | |
| 2015/0209761 A1 | 7/2015 | Cola | |
| 2019/0085138 A1 | 3/2019 | Lee et al. | |
| 2019/0189988 A1 | 6/2019 | Wardle et al. | |
| 2020/0123652 A1 | 4/2020 | Cui et al. | |
| 2020/0299135 A1 | 9/2020 | Wardle et al. | |
| 2022/0041451 A1 | 2/2022 | Wardle et al. | |

FOREIGN PATENT DOCUMENTS

| | | |
|---|---|---|
| JP | 2010-180454 A | 8/2010 |
| KR | 2007-0021757 A | 2/2007 |
| WO | WO 2001/047826 A1 | 7/2001 |
| WO | WO 2007/136755 A2 | 11/2007 |
| WO | WO 2020/123974 A1 | 6/2020 |

OTHER PUBLICATIONS

Yan et al., ACS Nano 2012, 6 (10), 9110-9117 (Supporting Information).*

International Search Report for International Patent Application No. PCT/US2019/066352, mailed Feb. 25, 2020.

Written Opinion of the International Searching Authority for International Patent Application No. PCT/US2019/066352, mailed Feb. 25, 2020.

International Preliminary Report on Patentability for International Patent Application No. PCT/US2019/066352, mailed Jun. 24, 2021.

[No Author Listed], Vantablack Technical Data Sheet. Surrey Nanosystems Ltd. Newhaven, UK. 2016. Retrieved Jul. 14, 2019. 4 pages.

Acauan et al., Direct synthesis of carbon nanomaterials via surface activation of bulk copper. Carbon. 2021;177:1-10. Epub Feb. 11, 2021. Supplementary Material included. 19 pages total.

Adams et al., Carbon Anodes for Nonaqueous Alkali Metal-Ion Batteries and Their Thermal Safety Aspects. Advanced Energy Materials. Sep. 19, 2019;9(35):1900550. Epub Aug. 5, 2019. 27 pages.

Aitola et al., High Temperature-Stable Perovskite Solar Cell Based on Low-Cost Carbon Nanotube Hole Contact. Advanced Materials. May 3, 2017;29(17):1606398. Epub Feb. 23, 2017. 5 pages.

Akselrod et al., Large-Area Metasurface Perfect Absorbers from Visible to Near-Infrared. Advanced Materials. Dec. 22, 2015;27(48):8028-34. Epub Nov. 9, 2015.

Akutsu et al., Vacuum and cryogenic compatible black surface for large optical baffles in advanced gravitational-wave telescopes. Optical Materials Express. Apr. 13, 2016;6(5):1613-26.

Anothumakkool et al., Peculiar Li-storage mechanism at graphene edges in turbostratic carbon black and their application in high energy Li-ion capacitor. Journal of Power Sources. Feb. 28, 2018;378:628-35. Epub Jan. 12, 2018.

Armbrüster et al., Al13Fe4 as a low-cost alternative for palladium in heterogeneous hydrogenation. Nature Materials. 2012;11:690-3. Epub Jun. 10, 2012.

Avraham et al., Patterned growth of carbon nanotube forests using Cu and Cu/Ag thin film reservoirs as growth inhibitors. Carbon. Apr. 2018;130:273-80. Epub Jan. 8, 2018.

Baturina et al., CO2 Electroreduction to Hydrocarbons on Carbon-Supported Cu Nanoparticles. ACS Catal. 2014;4(10):3682-95. Epub Sep. 3, 2014.

Bauman et al., Effect of Mo on the catalytic activity of Ni-based self-organizing catalysts for processing of dichloroethane into segmented carbon nanomaterials. Heliyon. 2019;5:e02428. Epub Sep. 6, 2019. 10 pages.

Berthelot, Hebd. Seances Acad. Sci. 1866;62:905.

Cao et al., End-bonded contacts for carbon nanotube transistors with low, size-independent resistance. Science. Oct. 2, 2015;350(6256):68-72.

Chen et al., A robust fuel cell operated on nearly dry methane at 500 enabled by synergistic thermal catalysis and electrocatalysis. Nature Energy. 2018;3:1042-50. Epub Oct. 29, 2018.

Chen et al., Highly Flexible and Efficient Solar Steam Generation Device. Adv. Mater. 2017;29:1701756. Epub Jun. 12, 2017. 8 pages.

Cheng et al., Graphene-Like-Graphite as Fast-Chargeable and High-Capacity Anode Materials for Lithium Ion Batteries. Scientific Reports. 2017;7:14782. Epub Nov. 1, 2017. 14 pages.

Cheng et al., Hydrogen spillover in the context of hydrogen storage using solid-state materials. Energy Environ. Sci. 2008; 1:338-54. Epub Jul. 3, 2008.

Chhoker et al., Field emission properties of carbon nanostructures: A review. 2007 International Workshop on Physics of Semiconductor Devices. IEEE. Mumbai, India. 2007:6 pages.

Chiang et al., Linking catalyst composition to chirality distributions of as-grown single-walled carbon nanotubes by tuning Ni(x)Fe(1-x) nanoparticles. Nat Mater. Nov. 2009;8(11):882-6. doi: 10.1038/nmat2531. Epub Sep. 20, 2009.

Cola et al., Increased real contact in thermal interfaces: A carbon nanotube/foil material. Applied Physics Letters. 2007;90:093513. Epub Mar. 2, 2007. 3 pages.

Cross, Processing Vertically Aligned Carbon Nanotubes for Heat Transfer Applications. Masters Thesis. Georgia Institute of Technology. Dec. 2008:121 pages.

Cui et al., Breakdown of Native Oxide Enables Multifunctional, Free-Form Carbon Nanotube-Metal Hierarchical Architectures. ACS Appl Mater Interfaces. Sep. 25, 2019;11(38):35212-35220. Epub Sep. 12, 2019. Pre-publication version provided. Supporting information included. 15 pages total.

Cui et al., Multifunctional graphene and carbon nanotube films for planar heterojunction solar cells. Progress in Energy and Combustion Science. Jan. 2019;70:1-21. Epub Sep. 26, 2018.

Cui et al., Scalable and Solid-State Redox Functionalization of Transparent Single-Walled Carbon Nanotube Films for Highly Efficient and Stable Solar Cells. Adv. Energy Mater. 2017;7:1700449. Epub May 12, 2017. 8 pages.

Cui et al., Synthesis of subnanometer-diameter vertically aligned single-walled carbon nanotubes with copper-anchored cobalt catalysts. Nanoscale. 2016;8(3):1608-17. Epub Dec. 2, 2015. Author manuscript provided. 13 pages.

Dervishi et al., Raman spectroscopy of bottom-up synthesized graphene quantum dots: size and structure dependence. Nanoscale. 2019;11:16571-81. Epub Aug. 22, 2019.

Dhanya et al., Lightning strike effect on carbon fiber reinforced composites—effect of copper mesh protection. Materials Today Communications. Sep. 2018;16:124-34. Epub May 26, 2018.

Ding et al., Superresilient Hard Carbon Nanofabrics for Sodium-Ion Batteries. Small. Mar. 19, 2020;16(11):1906883. Epub Feb. 20, 2020. 9 pages.

Dresselhaus et al., Topics in Applied Physics. Nanotechnology. Carbon nanotubes: synthesis, structure, properties, and applications. P. eds. 2001. Springer. vol. 80. 461 pages.

Dutkiewicz et al., Microstructure and properties of bulk copper matrix composites strengthened with various kinds of graphene nanoplatelets. Materials Science and Engineering: A. Mar. 25, 2015;628:124-34. Epub Jan. 15, 2015.

Enoki et al., Electronic structures of graphene edges and nanographene. International Reviews in Physical Chemistry. 2007;26(4):609-45. Epub Oct. 16, 2007.

(56) References Cited

OTHER PUBLICATIONS

Fajardo-Díaz et al., Synthesis, characterization and cyclic voltammetry studies of helical carbon nanostructures produced by thermal decomposition of ethanol on Cu-foils. Carbon. Dec. 2019;155:469-82. Epub Sep. 4, 2019.
Fan et al., Nanographene-Constructed Carbon Nanofibers Grown on Graphene Sheets by Chemical Vapor Deposition: High-Performance Anode Materials for Lithium Ion Batteries. ACS Nano. 2011;5(4):2787-94. Epub Mar. 22, 2011.
Faramarzi et al., Stepwise Melting Model for the Formation Mechanism of Ni Catalyst Nanoparticles for Carbon Nanotube Growth. J. Phys. Chem. C. 2011;115(39):18958-66. Epub Aug. 29, 2011.
Ferrari et al., Interpretation of Raman spectra of disordered and amorphous carbon. Phys. Rev. B. May 15, 2000;61(20):14095-107.
Ferrari et al., Origin of the 1150—cm-1 Raman mode in nanocrystalline diamond. Phys. Rev. B. Mar. 13, 200;63(12):121405. 4 pages.
Fiawoo et al., Evidence of correlation between catalyst particles and the single-wall carbon nanotube diameter: a first step towards chirality control. Phys Rev Lett. May 11, 2012;108(19):195503. doi: 10.1103/PhysRevLett.108.195503. Epub May 8, 2012. 5 pages.
Ghosh et al., Vertically aligned and tree-like carbon nanostructures as anode of lithium ion battery. Diamond and Related Materials. Aug. 2018;87:56-60. Epub May 17, 2018.
Gorbatikh et al., Hierarchical lightweight composite materials for structural applications. MRS Bulletin. 2016;41:672-7. Epub Sep. 8, 2016.
Guo et al., Active sites of nitrogen-doped carbon materials for oxygen reduction reaction clarified using model catalysts. Science. Jan. 22, 2016;351(6271):361-5. doi: 10.1126/science.aad0832.
Hafner et al., Surfaces of Complex Intermetallic Compounds: Insights from Density Functional Calculations. Acc. Chem. Res. 2014;47(11):3378-84. Epub Apr. 17, 2014.
Hao et al., Brazed Carbon Nanotube Arrays: Decoupling Thermal Conductance and Mechanical Rigidity. Advanced Materials Interfaces. Mar. 9, 2017;4(5):1601042. Epub Jan. 27, 2017. 8 pages.
He et al., A review on the status and challenges of electrocatalysts in lithium-sulfur batteries. Energy Storage Materials. Jul. 2019;20:55-70. Epub May 7, 2019.
He et al., Anomalous interface adhesion of graphene membranes. Scientific Reports. 2013;3:2660. Epub Sep. 16, 2013. 7 pages.
Heidenreich et al., A test object and criteria for high resolution electron microscopy. Journal of Applied Crystallography. 1968;1:1-19.
Hirsch, The era of carbon allotropes. Nature Materials. 2010;9:868-71. Epub Oct. 22, 2010.
Hou et al., Extended alcohol catalytic chemical vapor deposition for efficient growth of single-walled carbon nanotubes thinner than (6,5). Carbon. Aug. 2017;119:502-10. Epub Apr. 23, 2017.
Hsiao et al., Growth of a superhydrophobic multi-walled carbon nanotube forest on quartz using flow-vapor-deposited copper catalysts. Carbon. Nov. 2017;124:637-41. Epub Sep. 9, 2017.
Hu et al., Morphology and chemical state of Co—Mo catalysts for growth of single-walled carbon nanotubes vertically aligned on quartz substrates. Journal of Catalysis. Jul. 1, 2004;225(1):230-9. Epub May 18, 2004.
Hu et al., Raman spectroscopy study of the transformation of the carbonaceous skeleton of a polymer-based nanoporous carbon along the thermal annealing pathway. Carbon. Apr. 2015;85:147-58. Epub Jan. 2, 2015.
Hu et al., Tailoring Graphene Oxide-Based Aerogels for Efficient Solar Steam Generation under One Sun. Adv. Mater. 2017;29:1604031. Epub Nov. 25, 2016. 5 pages.
Huang et al., Nano effects of helium plasma treatment carbon nanotubes coating basalt filament. Mater. Sci. Forum. Jan. 2009; 610-613:722-7.
Huang et al., Single layer nano graphene platelets derived from graphite nanofibres. Nanoscale. 2016;8:8810-8. Epub Apr. 4, 2016. Author manuscript provided. 9 pages.
Huang et al., Temperature effect on the formation of catalysts for growth of carbon nanofibers. Carbon. Mar. 2009;47(3):795-803. Epub Nov. 27, 2008.
Iyengar et al., Ultralow reflectance metal surfaces by ultrafast laser texturing. Applied Optics. 2010;49(31):5983-8. Epub Oct. 21, 2010.
Jaiswal et al., Iron-based nanocatalyst for the acceptorless dehydrogenation reactions. Nature Communications. 2017;8:2147. Epub Dec. 15, 2017. 13 pages.
Jian et al., Gas-Induced Formation of Cu Nanoparticle as Catalyst for High-Purity Straight and Helical Carbon Nanofibers. ACS Nano. 2012;6(10):8611-9. Epub Sep. 10, 2012.
Jin et al., Covalently Connected Carbon Nanostructures for Current Collectors in Both the Cathode and Anode of Li—S Batteries. Advanced Materials. Nov. 2, 2016;28(41):9094-102. Epub Sep. 8, 2016.
Karwa et al., Scaled-up self-assembly of carbon nanotubes inside long stainless steel tubing. Carbon. Jun. 2006; 44(7): 1235-42.
Kaur et al., Enhanced thermal transport at covalently functionalized carbon nanotube array interfaces. Nature Communications. 2014;5:3082. Epub Jan. 22, 2014. 8 pages.
Khan et al., Electrical transport properties of Ni95Ti5 catalyzed multi wall carbon nanotubes film. J. Nanomat. Apr. 2009; 2009(2): 1-8.
Kharissova et al., Variations of interlayer spacing in carbon nanotubes. RSC Adv. 2014;4:30807-15. Epub Jun. 19, 2014.
Kim et al., Graphene modified copper current collector for enhanced electrochemical performance of Li-ion battery. Scripta. Mater. Mar. 15, 2018;146:100-4. Epub Nov. 20, 2017.
Kim et al., Reduction of CuO and Cu2O with H2: H Embedding and Kinetic Effects in the Formation of Suboxides. J. Am. Chem. Soc. 2003; 125(35):10684-92. Epub Aug. 6, 2003.
Kim et al., The interaction of hydrocarbons with copper-nickel and nickel in the formation of carbon filaments. Journal of Catalysis. Sep. 1991;131(1):60-73.
Kol'Tsova et al., Synthesis of carbon nanofibers on copper particles. Tech. Phys. Aug. 2015; 60(8): 1214-19.
Koutras et al., Influence of temperature on the strength of resistance welded glass fibre reinforced PPS joints. Composites Part A: Applied Science and Manufacturing. Feb. 2018;105:57-67. Epub Nov. 6, 2017.
Kudo et al., Mechanisms of titania nanoparticle mediated growth of turbostratic carbon nanotubes and nanofibers. Journal of Applied Physics. 2017;122:014301. Epub Jul. 6, 2017. 10 pages.
Kwon et al., Direct Chemical Synthesis of Plasmonic Black Colloidal Gold Superparticles with Broadband Absorption Properties. Nano Lett. Sep. 12, 2018;18(9):5927-5932. doi: 10.1021/acs.nanolett.8b02629. Epub Aug. 8, 2018.
Lahiri et al., High Capacity and Excellent Stability of Lithium Ion Battery Anode Using Interface-Controlled Binder-Free Multiwall Carbon Nanotubes Grown on Copper. ACS Nano. 2010;4(6):3440-6. Epub May 4, 2010.
Lee et al., Aligned Carbon Nanotube Film Enables Thermally Induced State Transformations in Layered Polymeric Materials. ACS Appl. Mater. Interfaces. 2015;7(16):8900-5. Epub Apr. 15, 2015.
Lehman et al., Carbon nanotube-based black coatings. Applied Physics Reviews. 2018;5:011103. Epub Feb. 15, 2018. 17 pages.
Lehman et al., Very Black Infrared Detector from Vertically Aligned Carbon Nanotubes and Electric-Field Poling of Lithium Tantalate. Nano Lett. 2010;10(9):3261-6. Epub Aug. 3, 2010.
Lespade et al., Caracterisation de materiaux carbones par microspectrometrie Raman. Carbon. 1984;22(4-5):375-85.
Li et al., Low-Temperature Growth of Carbon Nanotubes Catalyzed by Sodium-Based Ingredients. Angewandte Chemie International Edition. Jul. 1, 2019;58(27):9204-9. Epub May 27, 2019.
Liang et al., Interwoven MXene Nanosheet/Carbon-Nanotube Composites as Li—S Cathode Hosts. Adv. Mater. 2017;29:1603040. Epub Nov. 14, 2016. 7 pages.
Liatard et al., Vertically-aligned carbon nanotubes on aluminum as a light-weight positive electrode for lithium-polysulfide batteries. Chemical Communications. 2015;51(36):7749-52. Epub Apr. 2, 2015.

(56) References Cited

OTHER PUBLICATIONS

Lin et al., Carbon Nanotube Sponges, Aerogels, and Hierarchical Composites: Synthesis, Properties, and Energy Applications. Advanced Energy Materials. Sep. 7, 2016;6(17):1600554. Epub Jun. 14, 2016. 26 pages.
Lin et al., Chlorine effect on formation of turbostratic carbon nanofibers by a mixture of 1,2-dichloroethane and ethanol. Journal of the Taiwan Institute of Chemical Engineers. Jul. 2014;45(4):1883-91. Epub Nov. 28, 2013.
Liu et al., Pitch-Derived Soft Carbon as Stable Anode Material for Potassium Ion Batteries. Advanced Materials. Apr. 28, 2020;32(17):2000505. Epub Mar. 12, 2020. 8 pages.
López et al., Electronic Effects in the Activation of Supported Metal Clusters: Density Functional Theory Study of H2 Dissociation on Cu/SiO2. The Journal of Physical Chemistry B. 1999;103(40):8552-7. Epub Sep. 18, 1999.
Mallet-Ladeira et al., A Raman study to obtain crystallite size of carbon materials: A better alternative to the Tuinstra-Koenig law. Carbon. Dec. 2014;80:629-39. Epub Sep. 15, 2014.
Mao et al., Foldable interpenetrated metal-organic frameworks/carbon nanotubes thin film for lithium-sulfur batteries. Nature Communications. 2017;8:14628. Epub Mar. 6, 2017. 8 pages.
McCafferty et al., Thermodynamics of Corrosion: Pourbaix Diagrams. Introduction to Corrosion Science. Springer, New York, NY. Nov. 2009;95-117.
Mecklenburg et al., Aerographite: Ultra Lightweight, Flexible Nanowall, Carbon Microtube Material with Outstanding Mechanical Performance. Advanced Materials. Jul. 10, 2012;24(26):3486-90. Epub Jun. 12, 2012.
Meng et al., Advances in Structure and Property Optimizations of Battery Electrode Materials. Joule. Nov. 15, 2017;1:522-47.
Meshot et al., Engineering Vertically Aligned Carbon Nanotube Growth by Decoupled Thermal Treatment of Precursor and Catalyst. ACS Nano. 2009;3(9):2477-86. Epub Aug. 19, 2009.
Miao et al., Growth of carbon nanotubes on transition metal alloys by microwave-enhanced hot-filament deposition. Thin Solid Films. Jul. 22, 2005; 484(1-2): 58-63.
Miura et al., Millimeter-tall carbon nanotube arrays grown on aluminum substrates. Carbon. Apr. 2018;130:834-42. Epub Feb. 9, 2018. Corrigendum included. 2018;133:77.
Mizuno et al., A black body absorber from vertically aligned single-walled carbon nanotubes. PNAS. Apr. 2009;106(15):6044-7.
Nasibi et al., Nanoporous carbon black particles as an electrode material for electrochemical double layer capacitors. Materials Letters. Jan. 15, 2013;91:323-5. Epub Oct. 5, 2012.
Nasibulina et al., Direct synthesis of carbon nanofibers on the surface of copper powder. Carbon. Dec. 2010; 48(15):4559-62.
Nessim et al., Low temperature synthesis of vertically aligned carbon nanotubes with electrical contact to metallic substrates enabled by thermal decomposition of the carbon feedstock. Nano Lett. Oct. 2009;9(10):3398-405.
Nessim et al., The critical role of the underlayer material and thickness in growing vertically aligned carbon nanotubes and nanofibers on metallic substrates by chemical vapor deposition. Advanced Functional Materials. Apr. 14, 2010; 20(8): 1306-12.
Ni et al., Three dimensional porous frameworks for lithium dendrite suppression. Journal of Energy Chemistry. May 2020;44:73-89. Epub Oct. 1, 2019.
Pimenta et al., Studying disorder in graphite-based systems by Raman spectroscopy. Physical Chemistry Chemical Physics. 2007;9:1276-91. Epub Jan. 11, 2007.
Pitkänen et al., On-chip integrated vertically aligned carbon nanotube based super- and pseudocapacitors. Scientific Reports. 2017;7:16594. Epub Nov. 29, 2017. 7 pages.
Pitkänen et al., The Effect of Al Buffer Layer on the Catalytic Synthesis of Carbon Nanotube Forests. Top. Catal. 2015;58(14-17):1112-8. Epub Aug. 18, 2015.
Prins, Hydrogen spillover. Facts and fiction. Chem Rev. May 9, 2012;112(5):2714-38. doi: 10.1021/cr200346z. Epub Feb. 10, 2012.
Puech et al., Analyzing the Raman Spectra of Graphenic Carbon Materials from Kerogens to Nanotubes: What Type of Information Can Be Extracted from Defect Bands? Journal of Carbon Research. 2019;5(4):69. Epub Nov. 1, 2019. 20 pages.
Qian et al., Multifunctional Structural Supercapacitor Composites Based on Carbon Aerogel Modified High Performance Carbon Fiber Fabric. ACS Appl. Mater. Interfaces. 2013;5(13):6113-22. Epub May 13, 2013.
Qin et al., Effect of synthesis method of nanocopper catalysts on the morphologies of carbon nanofibers prepared by catalytic decomposition of acetylene. Journal of Catalysis. Apr. 25, 2004;223(2):389-94. Epub Mar. 19, 2004.
Rao et al., Carbon Nanotubes and Related Nanomaterials: Critical Advances and Challenges for Synthesis toward Mainstream Commercial Applications. ACS Nano. 2018;12:11756-84. Epub Dec. 5, 2018.
Reit et al., Growth time performance dependence of vertically aligned carbon nanotube supercapacitors grown on aluminum substrates. Electrochimica Acta. Feb. 2013;91:96-100. Epub Jan. 4, 2013.
Ren et al., Acetylene decomposition to helical carbon nanofibers over supported copper catalysts. Materials Research Bulletin. Dec. 4, 2007;42(12):2202-10. Epub Jan. 11, 2007.
Rodriguez et al., Catalytic Engineering of Carbon Nanostructures. Langmuir. Oct. 1, 1995;11(10):3862-6.
Rothlisberger et al., Investigating the mechanism of collective bidirectional growth of carbon nanofiber carpets on metallic substrates. Carbon. Nov. 2013;63:498-507. Epub Jul. 13, 2013.
Sakurai et al., Role of Subsurface Diffusion and Ostwald Ripening in Catalyst Formation for Single-Walled Carbon Nanotube Forest Growth. J. Am. Chem. Soc. 2012;134(4):2148-53. Epub Dec. 23, 2011.
Sanjabi et al., Modeling of the Heterogeneous Formation of Ni Catalyst Particles for Carbon Nanotube Growth. J. Phys. Chem. C. 2009;113(20):8652-9. Epub Apr. 23, 2009.
Saurel et al., A SAXS outlook on disordered carbonaceous materials for electrochemical energy storage. Energy Storage Materials. Sep. 2019;21:162-73. Epub May 15, 2019. Corrigendum included. 2020;28:418.
Schaffel et al., Tailoring the diameter, density and number of walls of carbon nanotubes through predefined catalyst particles. Physical Status Solidi A. Jun. 2008;205(6):1382-5. Epub May 29, 2008.
Schuepfer et al., Assessing the structural properties of graphitic and non-graphitic carbons by Raman spectroscopy. Carbon. May 2020;161:359-72. Epub Jan. 19, 2020.
Schwan et al., Raman spectroscopy on amorphous carbon films. Journal of Applied Physics. 1996;80(1):440-7. Epub Aug. 17, 1998.
Shaikjee et al., The effect of copper catalyst reducibility on low temperature carbon fiber synthesis. Materials Chemistry and Physics. Feb. 15, 2011;125(3):899-907. Epub Oct. 30, 2010.
Shaikjee et al., The synthesis, properties and uses of carbon materials with helical morphology. Journal of Advanced Research. Jul. 2012;3(3):195-223. Epub Aug. 3, 2011.
Shaikjee et al., The use of transmission electron microscopy tomography to correlate copper catalyst particle morphology with carbon fiber morphology. Carbon. Aug. 2011;49(9):2950-9. Epub Mar. 6, 2011.
Smith et al., Structural analysis of char by Raman spectroscopy: Improving band assignments through computational calculations from first principles. Carbon. Apr. 2016;100:678-92. Epub Jan. 13, 2016.
Sourmail, Near equiatomic FeCo alloys: Constitution, mechanical and magnetic properties. Progress in Materials Science. Sep. 7, 2005;50(7):816-80. Epub Jun. 14, 2005.
Spinelli et al., Broadband omnidirectional antireflection coating based on subwavelength surface Mie resonators. Nature Communications. 2012;3:692. Epub Feb. 21, 2012. 5 pages.
Stein et al., Mesoscale evolution of non-graphitizing pyrolytic carbon in aligned carbon nanotube carbon matrix nanocomposites. Journal of Materials Science. 2017;52:13799-811. Epub Aug. 22, 2017.

(56) References Cited

OTHER PUBLICATIONS

Su et al., Natural lavas as catalysts for efficient production of carbon nanotubes and nanofibers. Angew Chem Int Ed Engl. 2007;46(11):1823-4.

Subramaniam et al., One hundred fold increase in current carrying capacity in a carbon nanotube-copper composite. Nature Communications. 2013;4:2202. Epub Jul. 23, 2013. 7 pages.

Sun et al., Precipitation strengthening of aluminum alloys by room-temperature cyclic plasticity. Science. Mar. 1, 2019;363(6430):972-975. doi: 10.1126/science.aav7086.

Sun et al., Super Black Material from Low-Density Carbon Aerogels with Subwavelength Structures. ACS Nano. 2016;10:9123-8. Epub Sep. 2, 2016.

Szabó et al., Influence of synthesis parameters on CCVD growth of vertically aligned carbon nanotubes over aluminum substrate. Sci. Rep. Aug. 2007; 7(9557): 1-11.

Tajima et al., A first principles study on the CVD graphene growth on copper surfaces: A carbon atom incorporation to graphene edges. Surface Science. Nov. 2016;653:123-9. Epub Jun. 26, 2016.

Talapatra et al., Direct growth of aligned carbon nanotubes on bulk metals. Nat Nanotechnol. Nov. 2006;1(2):112-6. doi: 10.1038/nnano.2006.56. Epub Oct. 22, 2006.

Teblum et al., Millimeter-tall carpets of vertically aligned crystalline carbon nanotubes synthesized on copper substrates for electrical applications. The Journal of Physical Chemistry C. Jul. 2014; 118(33): 19345-55.

Tian et al., Surface structure deduced differences of copper foil and film for graphene CVD growth. Applied Surface Science. May 1, 2014;300:73-9. Epub Feb. 15, 2014.

Tong et al., Dense Vertically Aligned Multiwalled Carbon Nanotube Arrays as Thermal Interface Materials. IEEE Trans. Compon. Packag. Technol. Mar. 2007;30:92-100.

Tsaneva et al., Assessment of the structural evolution of carbons from microwave plasma natural gas reforming and biomass pyrolysis using Raman spectroscopy. Carbon. Dec. 2014;80:617-28. Epub Sep. 15, 2014.

Tsuji et al., Unexpected Efficient Synthesis of Millimeter-Scale Single-Wall Carbon Nanotube Forests Using a Sputtered MgO Catalyst Underlayer Enabled by a Simple Treatment Process. J. Am. Chem. Soc. 2016;138(51):16608-11. Epub Dec. 15, 2016.

Uemoto et al., Electrochemical Carbon Dioxide Reduction in Methanol at Cu and Cu2O-Deposited Carbon Black Electrodes. ChemEngineering. 2019;3(1):15. Epub Feb. 8, 2019. 10 pages.

Vander Wal et al., Substrate-support interactions in metal-catalyzed carbon nanofiber growth. Carbon. Dec. 2001;39(15):2277-89. Epub Oct. 29, 2001.

Wardle et al., Advanced Nanoengineered Materials. Aerospace Materials and Applications, Chapter 4. American Institute of Aeronautics and Astronautics, Inc. 2018:275-304.

Wu et al., Thin-walled carbon nanotubes grown using a zirconium catalyst. Carbon. Jun. 2010; 48(7): 1897-901.

Wu et al., Raman spectroscopy of graphene-based materials and its applications in related devices. Chemical Society Reviews. 2018;47(5):1822-73. Epub Jan. 25, 2018.

Wu et al., Synthesis and hydrogen storage capacity of exfoliated turbostratic carbon nanofibers. International Journal of Hydrogen Energy. May 2010;35(9):4123-30. Epub Mar. 11, 2010.

Xu et al., Carbon nanomaterials for advanced lithium sulfur batteries. Nano Today. Apr. 2018;19:84-107. Epub Mar. 7, 2018.

Yang et al., Liquid-Like, Self-Healing Aluminum Oxide during Deformation at Room Temperature. Nano Lett. 2018;18(4):2492-7. Epub Feb. 28, 2018.

Yang et al., Selective electrochemical reduction of CO2 by a binder-free platinum/nitrogen-doped carbon nanofiber/copper foil catalyst with remarkable efficiency and reusability. Electrochemistry Communications. Aug. 2018;93:138-42. Epub Jun. 30, 2018.

Yehezkel et al., Distinct Copper Electrodeposited Carbon Nanotubes (CNT) Tissues as Anode Current Collectors in Li-ion Battery. Electrochimica Acta. Mar. 1, 2017;229:404-14. Epub Jan. 27, 2017.

Yi et al., CVD growth and field electron emission of aligned carbon nanotubes on oxidized Inconel plates without addition of catalyst. Diam. Rel. Mater. Jul.-Sep. 2010; 19(7-9): 870-4.

Yin et al., Extremely Black Vertically Aligned Carbon Nanotube Arrays for Solar Steam Generation. ACS Appl. Mater. Interfaces. 2017;9(34):28596-603. Epub Aug. 3, 2017.

Yonezawa et al., Detailed investigation of the reduction process of cupric oxide (CuO) to form metallic copper fine particles with a unique diameter. Journals of Materials Science. 2010;45:6433-9. Epub Jul. 7, 2010.

Yu et al., Effect of an Auxiliary Plate on Passive Heat Dissipation of Carbon Nanotube-Based Materials. Nano Lett. Mar. 14, 2018;18(3):1770-1776. doi: 10.1021/acs.nanolett.7b04933. Epub Mar. 1, 2018.

Yu et al., Low-temperature synthesis of carbon nanofibers by decomposition of acetylene with a catalyst derived from cupric nitrate. Chemical Engineering Journal. Nov. 1, 2008;144(3):514-7. Epub Aug. 5, 2008.

Yu et al., Supercapacitor electrode materials: nanostructures from 0 to 3 dimensions. Energy & Environmental Science. 2015;8:702-30. Epub Dec. 3, 2014.

Yu et al., Superelastic Hard Carbon Nanofiber Aerogels. Advanced Materials. Jun. 6, 2019;31(23):1900651. Epub Apr. 15, 2019. 9 pages.

Zanin et al., Field Emission from Hybrid Diamond-like Carbon and Carbon Nanotube Composite Structures. ACS Appl Mater Interfaces. 2013;5(23):12238-43. Epub Nov. 13, 2013.

Zhang et al., Bending Ultrathin Graphene at the Margins of Continuum Mechanics. Physical Review Letters. Jun. 2011;106:255503. 4 pages.

Zhang et al., Bonding-geometry dependence of fractal growth on metal surfaces. Phys Rev Lett. Sep. 26, 1994;73(13):1829-1832. doi: 10.1103/PhysRevLett.73.1829.

Zhang et al., Carbon enables the practical use of lithium metal in a battery. Carbon. Oct. 2017;123:744-55. Epub Aug. 14, 2017.

Zhang et al., Unmasking chloride attack on the passive film of metals. Nature Communications. 2018;9:2559. Epub Jul. 2, 2018. 9 pages.

Zhao et al., Direct growth of carbon nanotubes on metal supports by chemical vapor deposition. Carbon Nanotubes—Synthesis, Characterization, Applications. Jul. 20, 2011; 99-120.

Zhao et al., Influence of copper crystal surface on the CVD growth of large area monolayer graphene. Solid State Communications. Apr. 2011;151(7):509-13. Epub Jan. 23, 2011.

Zheng et al., Multiwall carbon nanotube/copper porous coating for heat transfer application. Surface Engineering. 2015;31(10):723-32. Epub Apr. 2, 2015.

Zhou et al., 3D self-assembly of aluminium nanoparticles for plasmon-enhanced solar desalination. Nature Photonics. 2016;10:393-8. Epub Apr. 25, 2016.

Zhou et al., Copper catalyzing growth of single-walled carbon nanotubes on substrates. Nano Lett. Dec. 2006;6(12):2987-90.

Zhu et al., Synthesis of bamboo-like carbon nanotubes on a copper foil by catalytic chemical vapor deposition from ethanol. Carbon. Jun. 2012;50(7):2504-12. Epub Feb. 6, 2012.

Zoican Loebick et al., Selective synthesis of subnanometer diameter semiconducting single-walled carbon nanotubes. J Am Chem Soc. Aug. 18, 2010;132(32):11125-31. doi: 10.1021/ja102011h.

Zou et al., Single Carbon Fibers with a Macroscopic-Thickness, 3D Highly Porous Carbon Nanotube Coating. Adv Mater. Mar. 2018;30(13):e1704419. doi: 10.1002/adma.201704419. Epub Feb. 19, 2018. 9 pages.

* cited by examiner

FORMATION AND/OR GROWTH OF CARBON-BASED NANOSTRUCTURES ON COPPER-CONTAINING SUBSTRATES, AND RELATED SYSTEMS AND METHODS

RELATED APPLICATIONS

This application is a national stage filing under 35 U.S.C. § 371 of International Patent Application No. PCT/US2019/066352, filed Dec. 13, 2019, and entitled "Formation and/or Growth of Carbon-Based Nanostructures on Copper-Containing Substrates, and Related Systems and Methods," which claims priority under 35 U.S.C. § 119 (e) to U.S. Provisional Application No. 62/780,125, filed Dec. 14, 2018, and entitled "Formation and/or Growth of Carbon-Based Nanostructures on Metallic Substrates, Including Copper-Containing Substrates, and Related Systems and Methods," each of which is incorporated herein by reference in its entirety for all purposes.

TECHNICAL FIELD

Formation and/or growth of carbon-based nanostructures on copper-containing substrates, and related systems and methods, are generally described.

SUMMARY

Systems and methods for the formation and/or growth of carbon-based nanostructures on copper-containing substrates are generally described. Inventive articles comprising carbon-based nanostructures and copper-containing substrates are also described. The subject matter of the present invention involves, in some cases, interrelated products, alternative solutions to a particular problem, and/or a plurality of different uses of one or more systems and/or articles.

In one aspect, an article is provided. The article comprises, according to some embodiments, a substrate comprising copper metal and/or copper alloy; and elongated carbon-based nanostructures in direct contact with metallic copper of the substrate; wherein the copper metal and/or copper alloy of the substrate has at least one cross-sectional dimension of at least about 1 mm.

In another aspect, a method is disclosed. The method comprises, in some embodiments, exposing a substrate comprising metallic copper to a base such that a surface of the substrate is physically and/or chemically modified; and exposing the substrate to conditions causing the formation and/or growth of carbon-based nanostructures directly on metallic copper of the substrate.

The method comprises, in certain embodiments, exposing a substrate comprising a metal and/or metal alloy region comprising copper to at least one agent such that the at least one agent chemically and/or physically modifies the substrate; and exposing the substrate to conditions causing the formation and/or growth of carbon-based nanostructures directly on metallic copper of the substrate.

The method comprises, in certain embodiments, oxidizing metallic copper within a substrate, and exposing the substrate to conditions causing the oxidized copper to be reduced and causing the formation and/or growth of carbon-based nanostructures directly on the reduced copper.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIG. 5A shows elongated carbon-based nanostructure growth on a copper film on a wafer. FIGS. 5B and 5C show elongated carbon-based nanostructure growth on a fiber. FIG. 5D shows elongated carbon-based nanostructure growth on a copper TEM grid.

DETAILED DESCRIPTION

Figure 1A:
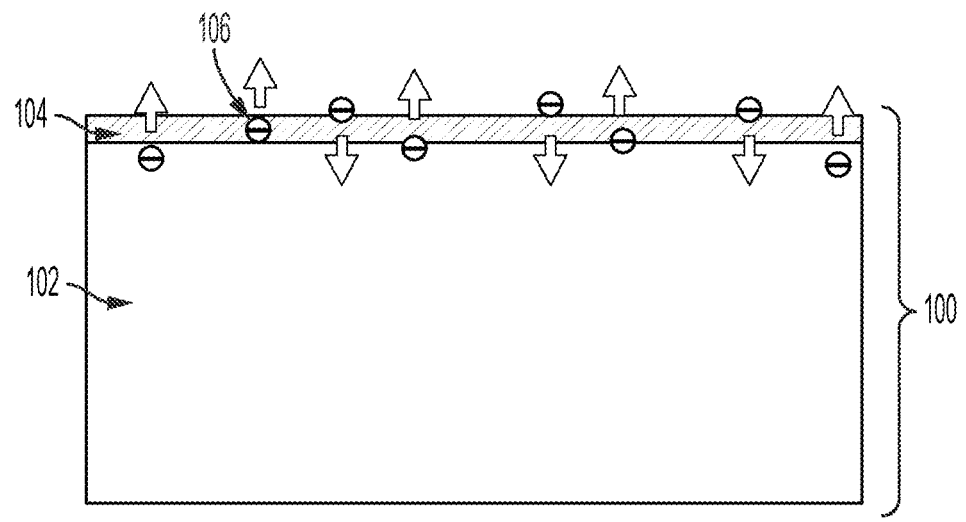
FIG. 1A is, in accordance with certain embodiments, a cross-sectional schematic illustration of an article comprising a copper-containing substrate and an optional oxide region.
Figure 1B:
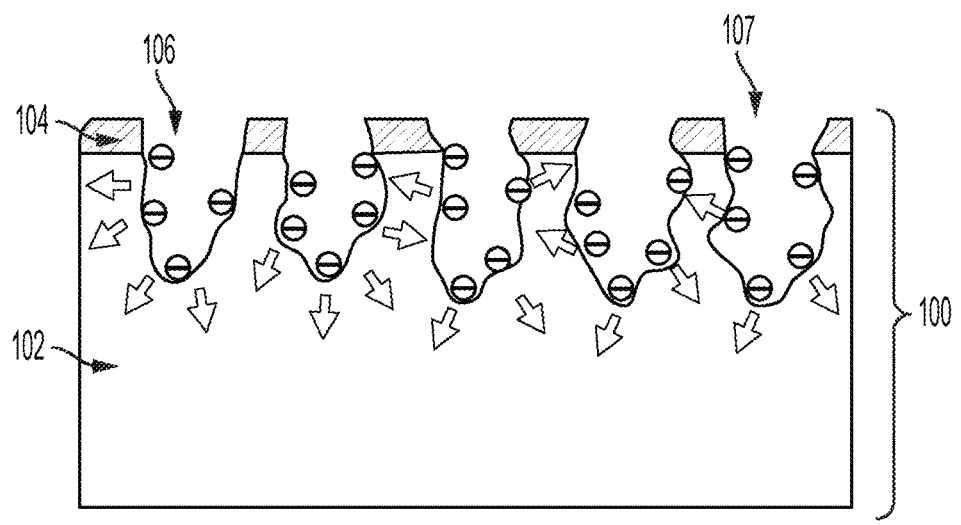
FIG. 1B is a cross-sectional schematic illustration of the article of FIG. 1A while being exposed to an agent, according to certain embodiments.

Systems and methods for the formation and/or growth of carbon-based nanostructures on copper-containing substrates are generally described. Inventive articles comprising carbon-based nanostructures and copper-containing substrates are also described. In certain embodiments, after the formation of the carbon-based nanostructures, the carbon-based nanostructures are arranged on the substrate such that an electronically conductive pathway is maintained from the substrate to the carbon-based nanostructures. This can be achieved, for example, by activating the surface of the substrate (e.g., removing and/or converting an oxide or other electronically insulating region from the substrate, altering a surface roughness of the substrate, and/or altering an oxidation state of the copper within the substrate) before or during formation and/or growth of the carbon-based nanostructures over the exposed metallic region.

In certain embodiments, growth of the carbon-based nanostructures is achieved directly on the bulk substrate. Such growth can be achieved, in certain embodiments, with no additional catalyst added to the substrate prior to or during growth. For example, in some embodiments, growth is achieved without the addition of catalyst nanoparticles to the substrate.

As noted above, certain aspects are related to methods of forming and/or growing carbon-based nanostructures. The carbon-based nanostructures can be grown on a growth substrate, in certain embodiments. A non-limiting example of one such method is shown in FIGS. 1A-1E.

According to certain embodiments, the substrate comprises a metal and/or metal alloy region (e.g., a copper metal or copper metal alloy region). For example, in FIG. 1A, substrate 100 comprises metal and/or metal alloy region 102. Optionally, the substrate may also include an initial metal oxide region (e.g., oxidized copper) over the metal and/or metal alloy region. For example, in FIG. 1A, substrate 100 comprises optional metal oxide region 104.

In some embodiments, the metal and/or metal alloy region comprises copper. For example, the metal and/or metal alloy region can be copper metal or a copper alloy. In some embodiments, copper makes up at least 50 atomic percent (at %) (or at least 75 at %, at least 90 at %, or at least 95 at %, or at least 99 at %) of the elements in the alloy. In accordance with certain embodiments, the substrate comprises a metal foil, a metal wire, an alloy sheet, bulk metal, metal assembly elements, metal rivets, metal screws, metal bolts, or combinations thereof. In some embodiments, the substrate comprises fiber metal hybrid laminates ("FMHLs") comprising copper. Optionally, titanium may also be present.

In certain embodiments, the optional oxide region, when present, is a native oxide region. That is to say, in some cases, when present, the metal oxide region comprises a native oxide of a metal (or metals) of the metal and/or metal alloy region. As a non-limiting example, in some embodiments, region 102 is a copper substrate and optional oxide region 104 is copper oxide (CuO).

In accordance with certain embodiments, the substrate comprises metallic copper. As used herein, the term "metallic" refers to a material in which metal atoms are not chemically bound to a non-metal or a metalloid. As a non-limiting example, Co metal is a metallic species. On the other hand, the Co atoms in CoO are not a metallic species (because they are bound to oxygen, a non-metal). Similarly, Cu metal is a metallic species, but the Cu atoms in CuO are not.

In accordance with certain embodiments, the substrate comprises one or more dopants. As a non-limiting example, in some embodiments, the substrate comprises copper metal that includes one or more dopants. Examples of dopants include metals or metalloids. In certain embodiments, the dopant comprises a metal. According to some embodiments, the dopant comprises Ca, Mg, Sr, Ba, Y, S, and/or Mo, alone or in combination with other elements. In some embodiments, the substrate comprises less than about 5 at %, less than about 2 at %, less than about 1.5 at %, less than about 1 at %, less than about 0.5 at %, between about 0.1 at % and about 5 at %, between about 0.5 at % and about 3 at %, or between about 1 at % and about 2 at % dopant elements. In certain embodiments, the dopant may assist, promote, and/or stabilize the growth and/or formation of carbon-based nanostructures.

According to some embodiments, the substrate may initially comprise one or more dopants. In certain embodiments, a dopant can be applied to the substrate before or during exposing the substrate to conditions causing the formation and/or growth of carbon-based nanostructures. For example, in some embodiments, a material can be applied to the substrate, such that the material diffuses into the substrate, before or during exposing the substrate to conditions causing the formation and/or growth of carbon-based nanostructures.

In other embodiments, the substrate does not include a dopant.

According to some embodiments, the method comprises exposing the substrate to at least one agent such that the at least one agent chemically and/or physically modifies the substrate. For example, in FIG. 1A, substrate 100 is exposed to agent 106, which can be used to chemically and/or physically modify substrate 100. In some embodiments, the modification of the substrate can activate the substrate such that the substrate becomes capable of catalyzing the growth of carbon-based nanostructures. In some embodiments, before activation, the substrate is not able to catalyze the growth of carbon-based nanostructures or does so to only a limited degree.

A variety of agents can be used, alone or in combination, to modify the substrate. In some embodiments, the agent comprises one or more liquids. For example, in some embodiments, the at least one agent is a solution, such as an aqueous solution.

In embodiments, the at least one agent comprises a liquid and has a pH of at least 8 (or, in some embodiments, a pH of at least 9, at least 10, at least 11, at least 12, at least 13, at least 14, or higher). In some embodiments, the at least one agent comprises a strong base. Examples of strong bases include, for example, NaOH, KOH, LiOH, RbOH, CsOH, Ca(OH)$_2$, Ba(OH)$_2$, and Sr(OH)$_2$. Other bases (e.g., carbonates such as Na$_2$CO$_3$, sulfates such as CaSO$_4$, sulfites such as CaSO$_3$) could also be used. In some embodiments, the at least one agent comprises NaOH, KOH, Na$_2$CO$_3$, or mixtures thereof.

In some embodiments, the agent comprises a gas and/or a plasma. For example, in some embodiments, the agent comprises hydrogen gas. In certain embodiments, the agent comprises O$_2$ plasma.

In some embodiments, the agent contains oxygen atoms. For example, the agent may comprise hydroxide, O$_2$, or other sources of oxygen atoms.

In some instances in which an initial oxide layer is present on the substrate (e.g., an optional copper oxide layer), at least a portion of the initial metal oxide region (e.g., at least a portion of oxidized copper) is removed from the substrate by exposure to at least one agent. For example, in FIG. 1B, substrate 100 is exposed to agent 106, which results in removal of at least a portion of optional metal oxide region 104. Examples of agents that can be used to remove the oxide region include, for example, acids such as sulfuric acid, nitric acid, hydrochloric acid, and/or acetic acid. In other cases, an agent (e.g., a base) can be used to etch or otherwise remove underlying metallic copper or other metals, which can also result in the removal of the oxide from the substrate as the metallic material is removed. It should be understood that the removal of any initial oxide region that may be present on the substrate is optional, and in some embodiments, even when an initial oxide region is present, oxide removal might not be performed.

In certain embodiments, exposing the substrate to the at least one agent comprises removing metal from the metal and/or metal alloy region to alter (e.g., increase or decrease) a surface roughness of the metal and/or metal alloy region. For example, in FIG. 1B, exposing substrate 100 to agent 106 results in removal of metal from the metal and/or metal alloy region 102. This leads to an increase in the roughness of top surface 107. As one example, in some embodiments, the at least one agent comprises a base (e.g., any of the bases listed above or elsewhere herein), and exposure of the substrate to the base results in removal and/or conversion of copper from the substrate. Optionally, exposure of the substrate to the base can also result in the removal and/or conversion of oxidized copper from the substrate, for example, via the removal of copper atoms underneath the oxidized copper.

In some embodiments, exposing the substrate to the at least one agent comprises changing an oxidation state of copper in the substrate. In some such embodiments, the agent is an oxidizing agent, and exposure of the copper to the agent oxidizes the copper. For example, in some embodiments, the agent comprises a base (e.g., any of the bases mentioned above or elsewhere herein, such as NaOH, KOH, $Na_2CO_3$, etc.), and exposure of the substrate to the base oxidizes copper in the substrate (e.g., to form CuO, CuOH, and/or other forms of oxidized copper).

The oxidation state of the copper can be changed using other type of agents. For example, in some embodiments, the agent comprises $H_2$ gas, and exposure of the substrate to the $H_2$ gas reduces oxidized copper to metallic copper.

In some embodiments, the copper can first be exposed to an oxidizing agent (e.g., a base, such as any of the bases mentioned above or elsewhere herein) such that the copper is oxidized, and then subsequently exposed to a reducing agent (e.g., hydrogen, other reducing agents) such that the oxidized copper is reduced. In some embodiments, carbon-based nanostructures can then be grown from the reduced copper (e.g., such that the carbon-based nanostructures are in direct contact with a metallic form of copper that had previously been oxidized and then reduced). In some embodiments, the reducing agent is part of the environment in which the carbon-based nanostructures are grown. For example, in some embodiments, hydrogen present in the stream containing the carbon-based nanostructure precursor, and that hydrogen can be used as the reducing agent.

In some embodiments, the substrate can be exposed to multiple agents. As a non-limiting example, in some embodiments, the at least one agent 106 in FIG. 1A is two different agents. In some embodiments, both the first agent and the second agent are used to change an oxidation state of at least a portion of the copper metal from the substrate. For example, the first agent may be an oxidizing agent (e.g., a base such as any of the bases mentioned above or elsewhere herein). The base may be used to oxidize copper metal in the substrate. In some embodiments, a second agent can be used to further change an oxidation state of the copper. For example, in some embodiments, the second agent is a reducing agent (e.g., comprising hydrogen gas). In certain embodiments, the reducing agent can be used to reduce oxidized copper that was formed during exposure of the copper to the oxidizing agent (e.g., base).

In some embodiments, a first agent is used to remove oxidized copper from the substrate and/or to change an oxidation state of copper in the substrate, and a second agent that is different from the first agent is used to remove metal from the metal and/or metal alloy region to alter the surface roughness of the metal and/or metal alloy region.

The use of multiple agents is not required, and in other embodiments, only one agent is used. In some embodiments, a single agent is used (1) to remove at least a portion of oxidized copper from the substrate and/or change an oxidation state of copper in the substrate and (2) to remove metal from the metal and/or metal alloy region to alter (e.g., increase or decrease) the surface roughness of the metal and/or metal alloy region. For example, in FIG. 1B, a single agent could be used to alter the oxidation state of the metal and remove metal material. For example, in some embodiments, agent 106 is a strong base, such as NaOH. The strong base can be used to alter the oxidation state of copper metal and to remove and/or convert at least a portion of the copper metal from the metal and/or metal alloy region to alter the surface roughness of the metal and/or metal alloy region.

In some embodiments, the substrate can be etched. For example, in some embodiments, the substrate can be physically etched. Examples of etching techniques include, but are not limited to, ion gun etching, sputter etching, electron beam etching, plasma etching, and/or reactive ion etching. In some embodiments, the etching process involves the use of an oxygen-atom-containing material. The oxygen-atom-containing material can, in some embodiments, be used as an agent to alter an oxidation state of copper in the substrate.

In certain embodiments, there are additional steps that occur before, after, or concurrently with the exposing the substrate to the at least one agent. For example, sonication could be applied to the substrate before, after, or concurrently with the exposing the substrate to the at least one agent. In some embodiments, these additional steps may affect the removal of at least a portion of the metal (e.g., copper) and/or metal oxide (e.g., copper oxide) region from the substrate and/or may affect the removal of metal from the metal and/or metal alloy region to alter the surface roughness of the metal and/or metal alloy region. As a non-limiting example, in some embodiments, in FIG. 1B the at least one agent 106 comprises NaOH aqueous solution, and exposing the substrate can comprise immersing the substrate 100 in the NaOH aqueous solution 106 with bath sonication.

Figure 1C:
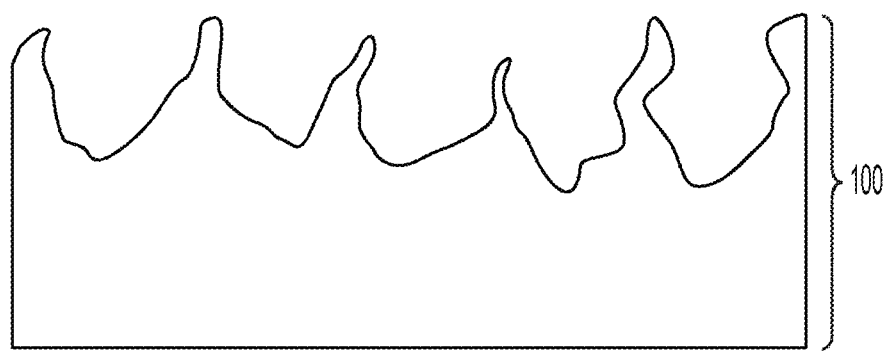
FIG. 1C is a cross-sectional schematic illustration of the article of FIGS. 1A and 1B after the article has been exposed to an agent, according to some embodiments.

In some embodiments, at least a portion (e.g., at least 10%, 25%, 50%, 75%, or more) of the metal oxide, if present, can be removed from the substrate. In some embodiments, the metal oxide, if present, can be completely (or substantially completely) removed from the substrate. For example, FIG. 1C is a cross-sectional schematic illustration of a substrate in which the optional initial metal oxide region 104 has been completely removed from substrate 100, leaving behind only metal and/or metal alloy portion 102. In other embodiments, at least some (e.g., at least 10%, 25%, 50%, 75%, or more) of the metal oxide portion, if present, may be left behind. In some embodiments, the metal oxide can be left behind in a pattern. For example, a mask may be used to selectively spatially expose the metal oxide material to form a patterned metal oxide material after exposure of the metal oxide material to the at least one agent.

In certain embodiments, the method comprises exposing the substrate to conditions causing the formation and/or growth of carbon-based nanostructures directly on at least one metallic species of the substrate. For example, in FIG.

1D, the substrate 100 comprises a metallic species 102, and carbon-based nanostructures 110 are in direct contact with metallic species 102. That is to say, in some cases, there is no metal oxide region from the substrate in between carbon-based nanostructures 110 and metallic species 102. In some embodiments, the metallic species of the substrate with which the formation and/or growth of carbon-based nanostructures is in direct contact is part of a relatively large-scale region of the metallic species (and/or an alloy containing the metallic species).

In certain embodiments, the substrate does not initially include a metallic species when exposed to conditions causing the formation and/or growth of carbon-based nanostructures, but the substrate subsequently comprises a metallic species during at least a portion of the exposing the substrate to conditions causing the formation and/or growth of carbon-based nanostructures, such that the formation and/or growth of the carbon-based nanostructures is directly on at least one metallic species of the substrate. As a non-limiting example, the substrate may be CuOH when initially exposed to conditions causing the formation and/or growth of carbon-based nanostructures. These conditions may reduce CuOH to metallic Cu, such that the substrate comprises a metallic species—metallic Cu—during at least a portion of the exposing substrate to conditions causing the formation and/or growth of carbon-based nanostructures, such that the formation and/or growth of the carbon-based nanostructures is directly on the at least one metallic species of the substrate—Cu.

In accordance with some embodiments, the substrate comprises metallic copper, and the carbon-based nanostructures are in direct contact with metallic copper of the substrate during at least a portion of the formation and/or growth of the carbon-based nanostructures. As a non-limiting example, in FIG. 1D, the substrate 100 comprises metallic copper 102, and carbon-based nanostructures 110 are in direct contact with metallic copper 102 during at least a portion of the formation and/or growth of carbon-based nanostructure 110.

In some embodiments, the process of exposing the substrate to conditions causing the formation and/or growth of carbon-based nanostructures directly on at least one metallic species of the substrate occurs without forming an oxide over the metal and/or metal alloy region of the substrate. This can occur, for example, by not exposing the substrate to oxygen during the exposing the substrate to conditions causing the formation and/or growth of carbon-based nanostructures.

In accordance with certain embodiments, there are additional steps that occur before, after, or concurrently with the exposing the substrate to conditions causing the formation and/or growth of carbon-based nanostructures directly on at least one metallic species of the substrate. For example, after the exposing the substrate to the at least one agent and before the exposing the substrate to conditions causing the formation and/or growth of carbon-based nanostructures directly on at least one metallic species of the substrate, the substrate may be rinsed. In certain embodiments, the rinse may comprise a liquid or a gas (e.g., noble gases). For example, in certain embodiments, the rinse comprises water (e.g., deionized (DI) water), an alcohol (e.g., a C1-C6 alcohol, such as ethanol), or mixtures thereof.

According to some embodiments, the exposing the substrate to conditions causing the formation and/or growth of carbon-based nanostructures directly on the at least one metallic species of the substrate comprises forming and/or growing the carbon-based nanostructures at a temperature at or between 250° C. and 600° C. As a non-limiting example, in FIG. 1E, the substrate 100 is exposed to conditions causing the formation and/or growth of carbon-based nanostructures 110 directly on substrate at a low temperature. In certain embodiments, the low temperature is at or less than 800° C., at or less than 700° C., at or less than 600° C., at or less than 500° C., or at or less than 400° C. In some embodiments, the low temperature is at or higher than 250° C., at or higher than 300° C., at or higher than 400° C., at or higher than 500° C., or at or higher than 600° C. In accordance with some embodiments, the low temperature is at or between 250° C. and 800° C., or at or between 250° C. and 600° C. In accordance with some embodiments, the conditions causing the formation and/or growth of carbon-based nanostructures directly on the substrate comprise an oxygen dehydrogenation reaction.

In certain embodiments, the conditions causing the formation and/or growth of carbon-based nanostructures directly on the substrate comprise use of $H_2$ gas, Ar gas, $C_2H_2$, or mixtures thereof. According to some embodiments, the carbon-based nanostructures comprise carbon nanotubes, carbon nanowires, and/or carbon nanofibers.

According to some embodiments, a support material can be added to the elongated carbon-based nanostructures. As a non-limiting example, in FIG. 1E, support material 130 has been added to elongated carbon-based nanostructures 110. Examples of support materials and uses thereof are included in more detail in the section below.

Certain aspects are related to articles. The articles may, for example, result from any of the methods described above (or elsewhere herein).

Figure 1D:
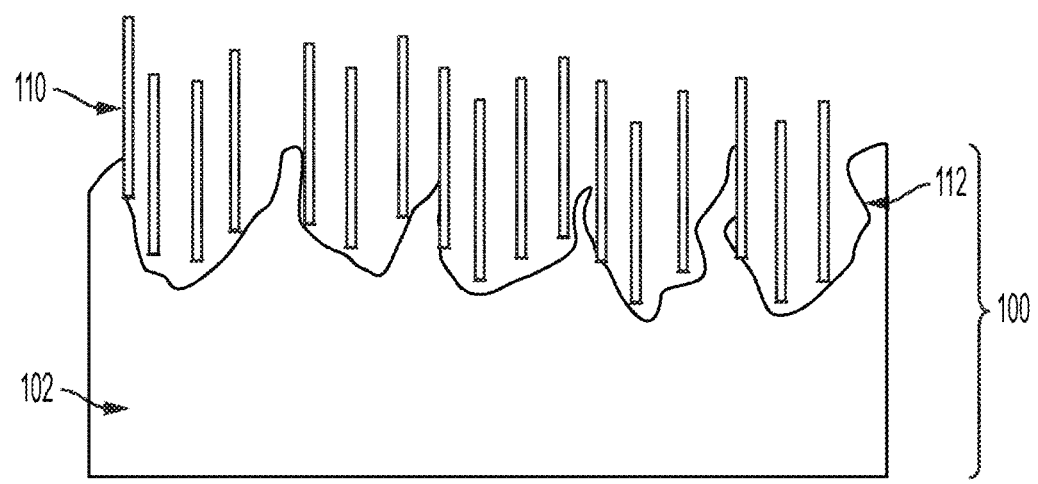
FIG. 1D is a cross-sectional schematic illustration of the article of FIG. 1C after elongated carbon-based nanostructures have been formed and grown, in accordance with certain embodiments.
Figure 1E:
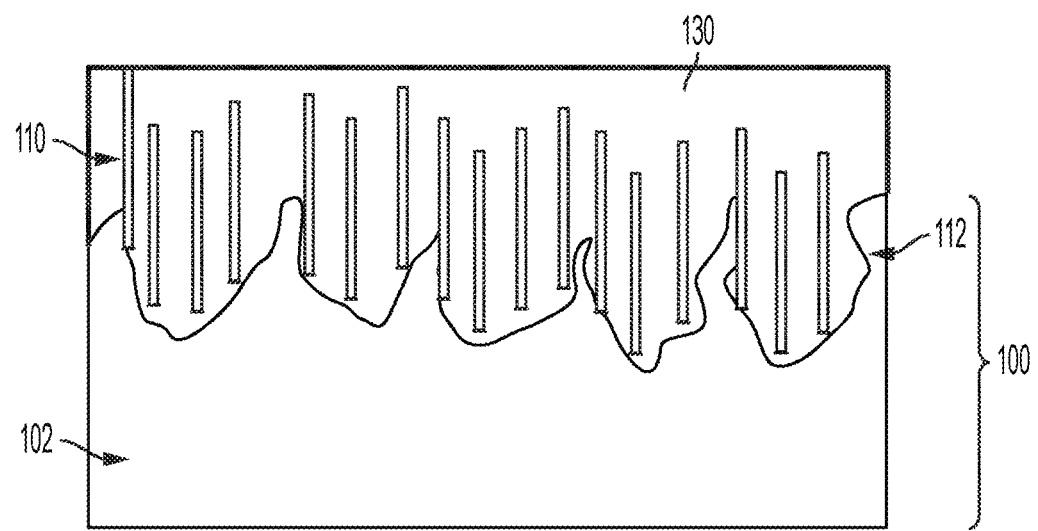
FIG. 1E is a cross-sectional schematic illustration of the article of FIG. 1D after a support material has been added to the elongated carbon-based nanostructures, according to some embodiments.

In certain embodiments, inventive articles comprise elongated carbon-based nanostructures. A non-limiting example of one such article is shown in FIG. 1D and FIG. 1E.

In accordance, with certain embodiments, an article comprising a substrate comprising copper metal and/or copper alloy is provided. For example, in FIG. 1D, substrate 100 comprises region 102, which can be copper metal and/or copper alloy. In some embodiments, the substrate is a copper metal substrate or a copper alloy substrate. In certain embodiments, copper makes up at least 50 at % (or at least 75 at %, at least 90 at %, or at least 95 at %, or at least 99 at %) of the elements in the alloy.

In accordance with certain embodiments, the substrate could be a metal foil, a metal wire, an alloy sheet, bulk metal, metal assembly elements, metal rivets, metal screws, metal bolts, or combinations thereof. In some embodiments, the substrate comprises fiber metal hybrid laminates ("FMHLs") comprising copper (optionally, also including titanium).

In certain embodiments, the substrate can include a metal and/or metal alloy region that has a relatively large scale. In accordance with certain embodiments, the substrate includes a metal and/or metal alloy region having at least one cross-sectional dimension of at least 1 mm, at least 5 mm, at least 1 cm, at least 10 cm, at least 1 m, or larger.

As one non-limiting embodiment, the substrate is a copper metal substrate or a copper alloy substrate. In some embodiments, the copper metal and/or copper alloy of the substrate has at least one cross-sectional dimension of at least 1 mm, at least 5 mm, at least 1 cm, at least 10 cm, at least 1 m, or larger. For example, in some embodiments, the copper metal and/or copper alloy of the substrate has at least one cross-sectional dimension of at least about 1 mm. As a non-limiting example, in FIG. 1D, metal region 102 can be copper metal (or a copper alloy) and can have at least one cross-sectional dimension of at least 1 mm, at least 5 mm, at least 1 cm, at least 10 cm, at least 1 m, or larger.

In certain embodiments, the substrate can have various thicknesses. For example, the thickness of substrate can be 1 cm or less, 5 mm or less, 2 mm or less, 1 mm or less, 500 µm or less, 200 µm or less, 100 µm or less, 50 µm or less, 25 µm or less, or thinner. In some embodiments, the thickness of the substrate can be at least 10 µm, at least 100 µm, at least 1 mm, or thicker. Combinations of these ranges are also possible.

In accordance with certain embodiments, the substrate comprises one or more dopants. As a non-limiting example, in some embodiments, the substrate comprises copper metal that includes one or more dopants. Examples of dopants include metals or metalloids. In certain embodiments, the dopant comprises a metal. According to some embodiments, the dopant comprises Ca, Mg, Sr, Ba, Y, and/or Mo, alone or in combination with other elements. In some embodiments, the substrate comprises less than about 10 at %, less than about 5 at %, less than about 2 at %, less than about 1.5 at %, less than about 1 at %, less than about 0.5 at %, between about 0.1 at % and about 5 at %, between about 0.5 at % and about 3 at %, or between about 1 at % and about 2 at % dopant elements. In certain embodiments, the dopant may assist, promote, and/or stabilize the growth and/or formation of carbon-based nanostructures.

In other embodiments, the substrate does not include a dopant.

In accordance with some embodiments, the article comprises elongated carbon-based nanostructures in direct contact with metallic copper of the substrate. As a non-limiting example, in FIG. 1D, elongated carbon-based nanostructures 110 can be in direct contact with metallic copper 102 of substrate 100.

In some embodiments, the elongated carbon-based nanostructures comprise carbon nanotubes, carbon nanowires, and/or carbon nanofibers. In certain embodiments, the elongated carbon-based nanostructures are in contact with a surface portion of the substrate that has nanoscale surface roughness. For example, in FIG. 1D, elongated carbon-based nanostructures 110 are in contact with surface portion 112 of substrate 100, which can have nanoscale surface roughness. As a non-limiting example, nanoscale surface roughness could be formed from removal of an uneven native metal oxide layer on a metal surface by at least one agent. As another example, nanoscale surface roughness could be formed by removal of metal from a surface by at least one agent. An article is said to exhibit nanoscale surface roughness when its RMS surface roughness, as measured with a scanning electron microscope, is between 10 nm and 500 nm.

According to certain embodiments, the article comprises a support material between and/or over the elongated carbon-based nanostructures. As a non-limiting example, in FIG. 1E, support material 130 is over elongated carbon-based nanostructures 110. Examples of support materials and uses thereof are included in more detail in the section below. In some embodiments, the support material can enter the interstices between the elongated carbon-based nanostructures, for example, via capillary action. In some embodiments, the support material wets the elongated carbon-based nano structures. In certain embodiments, the support material is added to the elongated carbon-based nanostructures as a liquid and is subsequently hardened (e.g., via solidification, polymerization and/or curing) to form a solid composite.

According to some embodiments, the articles disclosed herein and/or produced by the methods disclosed herein have high surface area, enhanced charge transfer, low optical and IR wavelength surface reflection, and/or decreased thermal and electrical interface resistance. The high surface area can be, for example, advantageous for chemical reactions. The high surface area could also be, for example, advantageous for the bonding of the substrate to other materials and structures via, for example, polymer adhesives or polymer composites. Without wishing to be bound by any particular theory, it is believed that the absence of an oxide layer (or other electronically insulating layer) between the carbon-based nanostructure and the conductive Cu substrate, in accordance with certain embodiments, contributes to faster and/or more efficient electron transfer at the interfaces between the carbon-based nanostructure and the conductive substrate.

Moreover, in certain embodiments, the methods disclosed herein allow for fast growth of carbon-based nanostructures. In some embodiments, elongated carbon-based nanostructures can be grown at rates of at least 100 µm per hour, at least 500 µm per hour, at least 750 µm per hour, or at least 1000 µm per hour (or more) over a period of at least 10 minutes, at least 30 minutes, at least 60 minutes, or more.

In some embodiments of the methods disclosed herein, the methods are solution-based processes, which facilitate the use of complex-shaped substrates as well as scaling for large-area industrial production. For example, in some embodiments, the methods disclosed herein can be deployed in a roll-to-roll fashion using solution baths.

In accordance with certain embodiments, the articles disclosed herein may be useful in applications including but not limited to structural applications such as fiber-metal hybrid laminates (FMHLs), sensing (e.g., near-infrared sensing), thermal dissipation, broadband electromagnetic absorption, energy harvesting and storage, solar cells, solar desalination, solar steam generation, flexible thermal/electrical interfaces/interconnects, lightweight and de-icing structural materials (e.g., for aerovehicles), and various space science applications, including but not limited to astronomy detectors, straylight absorbers, and starshades.

As used herein, the term "nanostructure" refers to an object having at least one cross-sectional dimension of less than 1 micron. In some embodiments, the nanostructure has at least one cross-sectional dimension of less than 500 nm, less than 250 nm, less than 100 nm, less than 75 nm, less than 50 nm, less than 25 nm, less than 10 nm, or, in some cases, less than 1 nm. Nanostructures described herein may have, in some cases, a maximum cross-sectional dimension of less than 1 micron, less than 500 nm, less than 250 nm, less than 100 nm, less than 75 nm, less than 50 nm, less than 25 nm, less than 10 nm, or, in some cases, less than 1 nm.

As used herein, the term "elongated nanostructure" refers to a structure having a maximum cross-sectional diameter of less than or equal to 1 micron and a length resulting in an aspect ratio greater than or equal to 10. In some embodiments, the elongated nanostructure can have an aspect ratio greater than or equal to 100, greater than or equal to 1000, greater than or equal to 10,000, or greater. Those skilled in the art would understand that the aspect ratio of a given structure is measured along the longitudinal axis of the elongated nanostructure, and is expressed as the ratio of the length of the longitudinal axis of the nanostructure to the maximum cross-sectional diameter of the nanostructure. The "longitudinal axis" of an article corresponds to the imaginary line that connects the geometric centers of the crosssections of the article as a pathway is traced, along the longest length of the article, from one end to another.

In some cases, the elongated nanostructure may have a maximum cross-sectional diameter of less than 1 micron, less than 100 nanometers, less than 50 nanometers, less than 25 nanometers, less than 10 nanometers, or, in some cases, less than 1 nanometer. A "maximum cross-sectional diameter" of an elongated nanostructure, as used herein, refers to the largest dimension between two points on opposed outer boundaries of the elongated nanostructure, as measured perpendicular to the length of the elongated nanostructure (e.g., the length of a carbon nanotube). The "average of the maximum cross-sectional diameters" of a plurality of structures refers to the number average.

The elongated nanostructure can have a cylindrical or pseudo-cylindrical shape, in some embodiments. In some embodiments, the elongated nanostructure can be a nanotube, such as a carbon nanotube. Other examples of elongated nanostructures include, but are not limited to, nanofibers and nanowires.

Elongated nanostructures can be single molecules (e.g., in the case of some nanotubes) or can include multiple molecules bound to each other (e.g., in the case of some nanofibers).

As used herein, the term "nanotube" refers to a substantially cylindrical elongated nanostructure comprising a fused network of primarily six-membered rings (e.g., six-membered aromatic rings). Nanotubes may include, in some embodiments, a fused network of at least 10, at least 100, at least 1000, at least $10^5$, at least $10^6$, at least $10^7$, or at least $10^8$ rings (e.g., six-membered rings such as six-membered aromatic rings), or more. In some cases, nanotubes may resemble a sheet of graphite formed into a seamless cylindrical structure. It should be understood that the nanotube may also comprise rings or lattice structures other than six-membered rings. According to certain embodiments, at least one end of the nanotube may be capped, i.e., with a curved or nonplanar aromatic group.

Elongated nanostructures may be formed of a variety of materials, in some embodiments. In certain embodiments, the elongated nanostructures comprise carbon (e.g., carbon-based nanostructures, described in more detail below). Other non-limiting examples of materials from which elongated nanostructures may be formed include silicon, indium-gallium-arsenide materials, boron nitride, silicon nitride (e.g., $Si_3N_4$), silicon carbide, dichalcogenides ($WS_2$), oxides (e.g., titanium dioxide, molybdenum trioxide), and boron-carbon-nitrogen compounds (e.g., $BC_2N_2$, $BC_4N$). In some embodiments, the elongated nanostructure may be formed of one or more inorganic materials. Non-limiting examples include semiconductor nanowires such as silicon (Si) nanowires, indium-gallium-arsenide (InGaAs) nanowires, and nanotubes comprising boron nitride (BN), silicon nitride ($Si_3N_4$), silicon carbide (SiC), dichalcogenides such as ($WS_2$), oxides such as titanium dioxide ($TiO_2$) and molybdenum trioxide ($MoO_3$), and boron-carbon-nitrogen compositions such as $BC_2N_2$ and $BC_4N$.

As used herein, the term "carbon-based nanostructure" refers to articles having a fused network of aromatic rings, at least one cross-sectional dimension of less than 1 micron, and comprising at least 30% carbon by mass. In some embodiments, the carbon-based nanostructures may comprise at least 40%, at least 50%, at least 60%, at least 70%, at least 80%, at least 90%, or at least 95% of carbon by mass, or more. The term "fused network" would not include, for example, a biphenyl group, wherein two phenyl rings are joined by a single bond and are not fused. Examples of carbon-based nanostructures include carbon nanotubes (e.g., single-walled carbon nanotubes, double-walled carbon nanotubes, multi-walled carbon nanotubes, etc.), carbon nanowires, carbon nanofibers, carbon nanoshells, graphene, fullerenes, and the like. In some embodiments, the carbon-based nanostructures comprise hollow carbon nanoshells and/or nanohorns.

In some embodiments, a carbon-based nanostructure may have at least one cross-sectional dimension of less than 500 nm, less than 250 nm, less than 100 nm, less than 75 nm, less than 50 nm, less than 25 nm, less than 10 nm, or, in some cases, less than 1 nm. Carbon-based nanostructures described herein may have, in some cases, a maximum cross-sectional dimension of less than 1 micron, less than 500 nm, less than 250 nm, less than 100 nm, less than 75 nm, less than 50 nm, less than 25 nm, less than 10 nm, or, in some cases, less than 1 nm.

According to certain embodiments, the carbon-based nanostructures are elongated carbon-based nanostructures. As used herein, the term "elongated carbon-based nanostructure" refers to a carbon-based nanostructure structure having a maximum cross-sectional diameter of less than or equal to 1 micron and a length resulting in an aspect ratio greater than or equal to 10. In some embodiments, the elongated nanostructure can have an aspect ratio greater than or equal to 100, greater than or equal to 1000, greater than or equal to 10,000, or greater. As noted above, those skilled in the art would understand that the aspect ratio of a given structure is measured along the longitudinal axis of the elongated nanostructure, and is expressed as the ratio of the length of the longitudinal axis of the nanostructure to the maximum cross-sectional diameter of the nanostructure.

In some cases, the elongated carbon-based nanostructure may have a maximum cross-sectional diameter of less than 1 micron, less than 100 nanometers, less than 50 nanometers, less than 25 nanometers, less than 10 nanometers, or, in some cases, less than 1 nanometer. As noted above, the "maximum cross-sectional diameter" of an elongated nanostructure, as used herein, refers to the largest dimension between two points on opposed outer boundaries of the elongated nanostructure, as measured perpendicular to the length of the elongated nanostructure (e.g., the length of a carbon nanotube). As noted above, the "average of the maximum cross-sectional diameters" of a plurality of structures refers to the number average.

The elongated carbon-based nanostructure can have a cylindrical or pseudo-cylindrical shape, in some embodiments. In some embodiments, the elongated carbon-based nanostructure can be a carbon nanotube. Other examples of elongated carbon-based nanostructures include, but are not limited to, carbon nanofibers and carbon nanowires.

Elongated carbon-based nanostructures can be single molecules or can include multiple molecules bound to each other.

In some embodiments, the carbon-based nanostructures described herein may comprise carbon nanotubes. As used herein, the term "carbon nanotube" is given its ordinary meaning in the art and refers to a substantially cylindrical molecule or nanostructure comprising a fused network of primarily six-membered rings (e.g., six-membered aromatic rings) comprising primarily carbon atoms. In some cases, carbon nanotubes may resemble a sheet of graphite formed into a seamless cylindrical structure. In some cases, carbon nanotubes may include a wall that comprises fine-grained $sp^2$ sheets. In certain embodiments, carbon nanotubes may have turbostratic walls. It should be understood that the carbon nanotube may also comprise rings or lattice structures other than six-membered rings. Typically, at least one end of the carbon nanotube may be capped, i.e., with a curved or nonplanar aromatic structure. Carbon nanotubes may have a diameter of the order of nanometers and a length on the order of millimeters, or, on the order of tenths of microns, resulting in an aspect ratio greater than 100, 1000, 10,000, 100,000, $10^6$, $10^7$, $10^8$, $10^9$, or greater. Examples of carbon nanotubes include single-walled carbon nanotubes (SWNTs), double-walled carbon nanotubes (DWNTs), multi-walled carbon nanotubes (MWNTs) (e.g., concentric carbon nanotubes), inorganic derivatives thereof, organic derivatives thereof, and the like. In some embodiments, the carbon nanotube is a single-walled carbon nanotube. In some cases, the carbon nanotube is a multi-walled carbon nanotube (e.g., a double-walled carbon nanotube). In some cases, the carbon nanotube comprises a multi-walled or single-walled carbon nanotube with an inner diameter wider than is attainable from a traditional nanoscale feature or other nanoscale feature. In some cases, the carbon nanotube may have a diameter less than 1 micron, less than 500 nm, less than 250 nm, less than 100 nm, less than 50 nm, less than 25 nm, less than 10 nm, or, in some cases, less than 1 nm.

As noted above, certain embodiments are related to methods of growing carbon-based nanostructures. According to some embodiments, the method of growing carbon-based nanostructures comprises providing a substrate (e.g., a substrate comprising nanoscale features) and exposing a precursor of the carbon-based nanostructures to the substrate. In some embodiments, the substrate can have the properties described elsewhere herein upon being exposed to the carbon-based nanostructure precursor. In certain embodiments, the substrate has these properties at the beginning of a heating step used to form the carbon-based nanostructures. In certain embodiments, the substrate has these properties at at least one point in time during which the substrate is in a chamber or other vessel within which the carbon-based nanostructures are grown.

It should be understood that the growth of carbon-based nanostructures can include the initial nucleation/formation of the carbon-based nanostructure and/or making an existing carbon-based nanostructure larger in size. In certain embodiments, the growth of the carbon-based nanostructures comprises nucleating or otherwise forming the carbon-based nanostructures from material that is not a carbon-based nanostructure. In some embodiments, two or more carbon-based nanostructures may nucleate or otherwise form from a material that is not a carbon-based nanostructure. The two or more carbon-based nanostructures may be the same type of carbon-based nanostructure, or may be different types of carbon-based nanostructures. In some embodiments, the growth of the carbon-based nanostructures comprises making an existing carbon-based nanostructure larger in size. The growth process can also include both of these steps, in some cases. In certain embodiments, multiple growth steps can be performed, for example, using a single nanoscale feature to grow carbon-based nanostructures multiple times.

The precursor of the carbon-based nanostructures can be exposed to the substrate (e.g., nanoscale features of the substrate) in a number of ways. Generally, exposing the substrate (and/or nanoscale features of the substrate) comprises combining the nanostructure precursor and the substrate (and/or the nanoscale features of the substrate) with each other such that they are in contact. According to certain embodiments, exposing the precursor of the carbon-based nanostructures to the substrate comprises adding the precursor of the carbon-based nanostructures to the substrate. In certain embodiments, exposing the precursor of the carbon-based nanostructures to the substrate comprises adding the substrate to the precursor of the carbon-based nanostructures. In still other embodiments, the precursor of the carbon-based nanostructures and the substrate can be exposed to each other simultaneously. Other methods of exposure are also possible. Exposing the precursor of the carbon-based nanostructures to a substrate can occur, according to some embodiments, in a chamber or other volume. The volume in which the precursor of the carbon-based nanostructures is exposed to the substrate may be fully enclosed, partially enclosed, or completely unenclosed.

As noted above, according to certain embodiments, the precursor of the carbon-based nanostructures can be exposed to the substrate to grow the carbon-based nanostructures from the precursor.

According to certain embodiments, carbon from the precursor of the carbon-based nanostructures may be dissociated from the precursor. The dissociation of the carbon from the precursor can, according to certain embodiments, involve the breaking of at least one covalent bond. In other cases, the dissociation of the carbon from the precursor does not involve breaking a covalent bond. The carbon dissociated from the precursor may, according to certain embodiments, chemically react to grow the carbon-based nanostructures via the formation of new covalent bonds (e.g., new carbon-carbon covalent bonds). In the growth of carbon nanotubes, for example, the nanostructure precursor material may comprise carbon, such that carbon dissociates from the precursor molecule and may be incorporated into the growing carbon nanotube via the formation of new carbon-carbon covalent bonds.

As described in more detail elsewhere herein, a variety of materials can be used as the precursor of the carbon-based nanostructures and as the substrate. According to certain embodiments, carbon-based nanostructures (e.g., carbon nanotubes) may be synthesized using $CO_2$ and acetylene as precursors of the carbon-based nanostructures.

In some embodiments, the method of growing carbon-based nanostructures comprises exposing the substrate to a set of conditions that causes growth of carbon-based nanostructures on the substrate (e.g., on nanoscale features of the substrate). Growth of the carbon-based nanostructures may comprise, for example, heating the precursor of the carbon-based nanostructures, the substrate, or both. Other examples of suitable conditions under which the carbon-based nanostructures may be grown are described in more detail below. In some embodiments, growing carbon-based nanostructures comprises performing chemical vapor deposition (CVD) of nanostructures on the substrate. In some embodiments, the chemical vapor deposition process may comprise a plasma chemical vapor deposition process. Chemical vapor deposition is a process known to those of ordinary skill in the art, and is explained, for example, in Dresselhaus M S, Dresselhaus G., and Avouris, P. eds. "Carbon Nanotubes: Synthesis, Structure, Properties, and Applications" (2001) Springer, which is incorporated herein by reference in its entirety. Examples of suitable nanostructure fabrication techniques are discussed in more detail in International Patent Application Serial No. PCT/US2007/011914, filed May 18, 2007, entitled "Continuous Process for the Production of Nanostructures Including Nanotubes," published as WO 2007/136755 on Nov. 29, 2007, which is incorporated herein by reference in its entirety.

According to some embodiments, the nanostructure precursor comprises carbon dioxide ($CO_2$). The carbon dioxide in the nanostructure precursor can be in any state of matter, including solid, liquid, and/or gas. In certain, although not necessarily all, embodiments, a gaseous carbon dioxide nanostructure precursor is used. The carbon dioxide can be in more than one of these forms, e.g., when the reaction conditions comprise a temperature and pressure when more than one phase of carbon dioxide is stable. In some embodiments, carbon dioxide is the only nanostructure precursor present. In other embodiments, carbon dioxide is one of two or more nano structure precursors to which the substrate is exposed. Without wishing to be bound by any particular theory, it has been observed that the use of carbon dioxide nanostructure precursors can aid in the growth of carbon-based nanostructures (e.g., carbon nanotubes) at relatively low temperatures, compared to the temperatures at which carbon-based nanostructures can be grown in the absence of the carbon dioxide but under otherwise essentially identical conditions.

According to some embodiments, the nanostructure precursor comprises at least one of a hydrocarbon and an alcohol. In certain embodiments, the nanostructure precursor may contain one or more hydrocarbons but no alcohols. In other embodiments, the nanostructure precursor may contain one or more alcohols but no hydrocarbons. In yet other embodiments, the nanostructure precursor may contain both one or more hydrocarbons and one or more alcohols. In some such embodiments, the hydrocarbon(s) and/or alcohol(s) are the only nanostructure precursors present. In other embodiments, the nanostructure precursor further comprises additional molecules. For example, in some embodiments, the nanostructure precursor comprises carbon dioxide in addition to a hydrocarbon and/or an alcohol. In one particular set of embodiments, the nanostructure precursor comprises at least one alkyne (e.g., acetylene) and carbon dioxide.

The term "hydrocarbon" is used herein to describe organic compounds consisting only of hydrogen and carbon. A hydrocarbon may be saturated or unsaturated (at one or more locations) and may have a linear, branched, monocyclic, or polycyclic structure. A hydrocarbon may be aliphatic or aromatic, and may contain one or more alkyl, alkene, and/or alkyne functional groups. In certain embodiments, the hydrocarbon is an alkane. In some embodiments, the hydrocarbon is an alkene. In certain embodiments, the hydrocarbon is an alkyne. In some embodiments, the hydrocarbon is a $C_1$-$C_{10}$ hydrocarbon, such as a $C_1$-$C_8$ hydrocarbon, a $C_1$-$C_6$ hydrocarbon, or a $C_1$-$C_4$ hydrocarbon. For example, in some embodiments, the hydrocarbon is a $C_1$-$C_{10}$ alkyne, a $C_1$-$C_8$ alkyne, a $C_1$-$C_6$ alkyne, or a $C_1$-$C_4$ alkyne. In some embodiments, the hydrocarbon is a $C_1$-$C_{10}$ alkane, a $C_1$-$C_8$ alkane, a $C_1$-$C_6$ alkane, or a $C_1$-$C_4$ alkane. In certain embodiments, the hydrocarbon is a $C_1$-$C_{10}$ alkene, a $C_1$-$C_8$ alkene, a $C_1$-$C_6$ alkene, or a $C_1$-$C_4$ alkene. The hydrocarbon may have any molecular weight. Non-limiting examples of suitable hydrocarbons include methane ($CH_4$), ethylene ($C_2H_4$), and acetylene ($C_2H_2$). In certain but not necessarily all embodiments, the hydrocarbon comprises acetylene.

As used herein, the term "alcohol" refers to a molecule with at least one hydroxyl (—OH) functional group. Non-limiting examples of alcohols include methanol, ethanol, (iso)propanol, and butanol. Alcohols may be saturated or unsaturated (at one or more locations) and may have a linear, branched, monocyclic, or polycyclic structure. Alcohols may be aliphatic or aromatic, and may contain one or more alkyl, alkene, and/or alkyne functional groups. In certain but not necessarily all embodiments, alcohols may comprise more than one —OH functional group. In some embodiments, the alcohol is a $C_1$-$C_{10}$ alcohol, such as a $C_1$-$C_8$ alcohol, a $C_1$-$C_6$ alcohol, or a $C_1$-$C_4$ alcohol.

In some embodiments, at least 50% of the nanostructure precursor is made up of a combination of hydrocarbons, alcohols, and carbon dioxide. In certain embodiments, at least 60%, at least 70%, at least 80%, at least 90%, at least 95%, at least 99%, or all of the nanostructure precursor is made up of a combination of hydrocarbons, alcohols, and carbon dioxide. In certain embodiments, at least 50%, at least 60%, at least 70%, at least 80%, at least 90%, at least 95%, at least 99%, or all of the nanostructure precursor is made up of a combination of hydrocarbons and carbon dioxide. In certain embodiments, at least 60%, at least 70%, at least 80%, at least 90%, at least 95%, at least 99%, or all of the nanostructure precursor is made up of a combination of alkynes (e.g., $C_1$-$C_{10}$, $C_1$-$C_8$, $C_1$-$C_6$, or $C_1$-$C_4$ alkynes) and carbon dioxide. In certain embodiments, at least 60%, at least 70%, at least 80%, at least 90%, at least 95%, at least 99%, or all of the nanostructure precursor is made up of a combination of acetylene and carbon dioxide. Other ranges are also possible.

As noted above, the nano structure precursor material can be in any suitable phase. In one set of embodiments, the nanostructure precursor material comprises a solid. Examples of solid nanostructure precursor materials include, for example, coal, coke, amorphous carbon, unpyrolyzed organic polymers (e.g., phenol-formaldehyde, resorcinol-formaldehyde, melamine-formaldehyde, etc.), partially pyrolyzed organic polymers, diamond, graphene, graphite, or any other suitable solid form of carbon. In some embodiments, the solid nanostructure precursor material may contain carbon in an amount of at least 25 wt %, at least 50 wt %, at least 75 wt %, at least 85 wt %, at least 90 wt %, at least 95 wt %, at least 98 wt %, or at least 99 wt %.

In one set of embodiments, the nanostructure precursor material comprises both a solid and a non-solid (e.g., a liquid, a gas, etc.). For example, the nanostructure precursor material can comprise a solid form of carbon placed close to or in contact with the substrate and a vapor-phase nanostructure precursor material. As a specific example, the solid nanostructure precursor component can be deposited on or near the substrate as soot, amorphous carbon, graphene, or graphite, and the substrate can be exposed to vapor comprising a hydrocarbon (e.g., methane, ethylene, acetylene, and the like). Not wishing to be bound by any particular theory, under some growth conditions, the presence of the solid nanostructure precursor material can allow for nanostructure growth that might not occur in the absence of the solid nanostructure precursor material. In some cases, the solid precursor material might provide a base from which the non-solid nanostructure precursor material can be added to grow the carbon-based nanostructure. For example, in some embodiments, a small portion of a carbon nanotube can be used as a starting material from which a larger nanotube can be grown using non-solid carbon nanostructure precursor material.

As noted above, certain embodiments comprise exposing the nanostructure precursor and the substrate to a set of conditions that causes growth of carbon-based nanostructures on the substrate. In some cases, the set of conditions may facilitate nucleation of carbon-based nanostructures during the growth process. According to certain embodiments, carbon-based nanostructures can be grown at relatively low temperatures. The ability to grow carbon-based nanostructures at relatively low temperatures can be advantageous, according to certain but not necessarily all embodiments, as the use of low temperatures can reduce the amount of energy needed to perform the growth process. According to some embodiments, the substrate is at a temperature of less than or equal to 750° C., less than or equal to 700° C., less than or equal to 650° C., less than or equal to 600° C., less than or equal to 500° C., less than or equal to 450° C., less than or equal to 425° C., less than or equal to 400° C., less than or equal to 350° C., less than or equal to 300° C., less than or equal to 250° C., less than or equal to 200° C., less than or equal to 150° C., or less than or equal to 100° C. during the growth of the carbon-based nanostructures. The temperature of the substrate during the growth of the carbon-based nanostructures may be greater than or equal to 50° C., greater than or equal to 100° C., greater than or equal to 150° C., greater than or equal to 200° C., greater than or equal to 250° C., greater than or equal to 300° C., greater than or equal to 350° C., greater than or equal to 400° C., greater than or equal to 425° C., greater than or equal to 450° C., greater than or equal to 500° C., greater than or equal to 600° C., greater than or equal to 700° C., greater than or equal to 800° C., greater than or equal to 900° C., greater than or equal to 1000° C., or greater than or equal to 1100° C., according to certain embodiments. Combinations of the above referenced ranges are also possible (for example, greater than or equal to 100° C. and less than or equal to 500° C., greater than or equal to 100° C. and less than or equal to 1200° C., or greater than or equal to 350° C. and less than or equal to 720° C.). Other ranges are also possible.

In some embodiments, the precursor of the carbon-based nanostructures is at a temperature of less than or equal to 1200° C., less than or equal to 1100° C., less than or equal to 1000° C., less than or equal to 900° C., less than or equal to 800° C., less than or equal to 720° C., less than or equal to 700° C., less than or equal to 600° C., less than or equal to 500° C., less than or equal to 450° C., less than or equal to 425° C., less than or equal to 400° C., less than or equal to 350° C., less than or equal to 300° C., less than or equal to 250° C., less than or equal to 200° C., less than or equal to 150° C., or less than or equal to 100° C. during the growth of the carbon-based nanostructures. The temperature of the precursor of the carbon-based nanostructures during the growth of the carbon-based nanostructures may be greater than or equal to 50° C., greater than or equal to 100° C., greater than or equal to 150° C., greater than or equal to 200° C., greater than or equal to 250° C., greater than or equal to 300° C., greater than or equal to 350° C., greater than or equal to 400° C., greater than or equal to 425° C., greater than or equal to 450° C., greater than or equal to 500° C., greater than or equal to 600° C., greater than or equal to 700° C., greater than or equal to 800° C., greater than or equal to 900° C., greater than or equal to 1000° C., or greater than or equal to 1100° C., according to certain embodiments. Combinations of the above referenced ranges are also possible (for example, greater than or equal to 100° C. and less than or equal to 500° C., greater than or equal to 100° C. and less than or equal to 1200° C., or greater than or equal to 350° C. and less than or equal to 720° C.). Other ranges are also possible. In some embodiments, the precursor of the carbon-based nanostructures is at a temperature outside the ranges listed above during the growth of the carbon-based nanostructures.

In certain embodiments, the substrate (when present) is at a temperature of less than or equal to 1200° C., less than or equal to 1100° C., less than or equal to 1000° C., less than or equal to 900° C., less than or equal to 800° C., less than or equal to 720° C., less than or equal to 700° C., less than or equal to 600° C., less than or equal to 500° C., less than or equal to 450° C., less than or equal to 425° C., less than or equal to 400° C., less than or equal to 350° C., less than or equal to 300° C., less than or equal to 250° C., less than or equal to 200° C., less than or equal to 150° C., or less than or equal to 100° C. during the growth of the carbon-based nanostructures. The temperature of the substrate (when present) during the growth of the carbon-based nanostructures may be greater than or equal to 50° C., greater than or equal to 100° C., greater than or equal to 150° C., greater than or equal to 200° C., greater than or equal to 250° C., greater than or equal to 300° C., greater than or equal to 350° C., greater than or equal to 400° C., greater than or equal to 425° C., greater than or equal to 500° C., greater than or equal to 600° C., greater than or equal to 700° C., greater than or equal to 800° C., greater than or equal to 900° C., greater than or equal to 1000° C., or greater than or equal to 1100° C., according to certain embodiments. Combinations of the above referenced ranges are also possible (for example, greater than or equal to 100° C. and less than or equal to 500° C., greater than or equal to 100° C. and less than or equal to 1200° C., or greater than or equal to 350° C. and less than or equal to 720° C.). Other ranges are also possible.

According to certain embodiments, carbon-based nanostructure growth can occur within a vessel within which the temperature of the enclosed space is less than or equal to 1200° C., less than or equal to 1100° C., less than or equal to 1000° C., less than or equal to 900° C., less than or equal to 800° C., less than or equal to 720° C., less than or equal to 700° C., less than or equal to 600° C., less than or equal to 500° C., less than or equal to 450° C., less than or equal to 425° C., less than or equal to 400° C., less than or equal to 350° C., less than or equal to 300° C., less than or equal to 250° C., less than or equal to 200° C., less than or equal to 150° C., or less than or equal to 100° C. during the growth of the carbon-based nanostructures. The temperature of the enclosed space during the growth of the carbon-based nanostructures may be greater than or equal to 50° C., greater than or equal to 100° C., greater than or equal to 150° C., greater than or equal to 200° C., greater than or equal to 250° C., greater than or equal to 300° C., greater than or equal to 350° C., greater than or equal to 400° C., greater than or equal to 425° C., greater than or equal to 450° C., greater than or equal to 500° C., greater than or equal to 600° C., greater than or equal to 700° C., greater than or equal to 800° C., greater than or equal to 900° C., greater than or equal to 1000° C., or greater than or equal to 1100° C., according to certain embodiments. Combinations of the above referenced ranges are also possible (for example, greater than or equal to 100° C. and less than or equal to 500° C., greater than or equal to 100° C. and less than or equal to 1200° C., or greater than or equal to 350° C. and less than or equal to 720° C.). Other ranges are also possible.

In certain embodiments, two or more of the substrate, the nanostructure precursor, and the vessel (when present) are at the same temperature. According to some embodiments, none of the substrate, nanostructure precursor, and vessel are at the same temperature. The temperature of any one or more components is higher or lower before and/or after growth for any period of time, in some embodiments.

In some cases, a source of external energy may be coupled with the growth apparatus to provide energy to cause the growth sites to reach the necessary temperature for growth. The source of external energy may provide thermal energy, for example, by resistively heating a wire coil in proximity to the growth sites (e.g., nanoscale features) or by passing a current through a conductive growth substrate. In some cases, the source of external energy may provide an electric and/or magnetic field to the substrate. In some cases, the source of external energy may be provided via magnetron heating, via laser, or via direct, resistive heating the growth substrate, or a combination of one or more of these. The source of external energy may be provided as a component of a closed loop temperature control system in some embodiments. It may be provided as part of an open loop temperature control system in some embodiments. In an illustrative embodiment, the set of conditions may comprise the temperature of the substrate surface, the chemical composition of the atmosphere surrounding the substrate, the flow and pressure of reactant gas(es) (e.g., nanostructure precursors) surrounding the substrate surface and within the surrounding atmosphere, the deposition or removal of materials on the surface of the substrate (when present), and/or optionally the rate of motion of the substrate. In some cases, the source of external energy may provide X-rays to the growth substrate. Not wishing to be bound by any particular theory, the X-rays might induce oxygen deficiency into the substrate, might activate the substrate, and/or it might change the gas species coming into contact with the substrate.

According to certain embodiments, exposure of the precursor of the carbon-based nanostructures to the substrate may occur at a particular temperature, pH, solvent, chemical reagent, type of atmosphere (e.g., nitrogen, argon, oxygen, etc.), electromagnetic radiation, or the like. In some cases, the set of conditions under which the precursor of the carbon-based nanostructures is exposed to the substrate may be selected to facilitate nucleation, growth, stabilization, removal, and/or other processing of nanostructures. In some cases, the set of conditions may be selected to facilitate reactivation, removal, and/or replacement of nanoscale features on the substrate. In some cases, the set of conditions may be selected to maintain the activity of the substrate. Some embodiments may comprise a set of conditions comprising exposure to a source of external energy. The source of energy may comprise electromagnetic radiation, electrical energy, sound energy, thermal energy, or chemical energy. For example, the set of conditions could comprise exposure to heat or electromagnetic radiation, resistive heating, exposure to a laser, or exposure to infrared light. In some embodiments, the set of conditions comprises exposure to a particular temperature, pressure, chemical species, and/or nanostructure precursor material.

According to certain embodiments, the growth of the carbon-based nanostructures from the nanostructure precursors can occur under conditions which are selected such that carbon nanotubes are selectively produced. In many cases, conditions (e.g., temperature, pressure, etc.) that lead to the production of other carbon-based nanostructures, such as graphene, cannot be successfully used to produce nanotubes. In some cases, carbon nanotubes will not grow on traditional substrates from which graphene will grow.

The growth of the carbon-based nanostructures can occur, in accordance with certain embodiments, under a gaseous atmosphere. The atmosphere can comprise the precursor and, optionally, one or more carrier gases which are not consumed during carbon-based nanostructure growth. Examples of suitable carrier gases include, but are not limited to, helium, argon, and nitrogen.

In certain embodiments in which carbon dioxide and at least one hydrocarbon (e.g., at least one alkyne) are used in the precursor of the carbon-based nanostructures, the molar ratio of carbon dioxide to the hydrocarbons (e.g., alkynes) is at least 0:1, at least 0.01:1, at least 0.05:1, at least 0.1:1; at least 0.2:1, at least 0.5:1, at least 1:1, or at least 2:1 (and/or, in certain embodiments, up to 0.01:1, up to 0.05:1, up to 0.1:1, up to 0.2:1, up to 0.5:1, up to 1:1, up to 2:1, up to 10:1, up to 13:1, up to 15:1, up to 20:1, up to 100:1, or more). For example, in some embodiments in which carbon dioxide and acetylene ($C_2H_2$) are used in the precursor of the carbon-based nanostructures, the molar ratio of carbon dioxide to acetylene is at least 0.01:1, at least 0.05:1, at least 0.1:1; at least 0.2:1, at least 0.5:1, at least 1:1, or at least 2:1 (and/or, in certain embodiments, up to 10:1, up to 13:1, up to 15:1, up to 20:1, up to 100:1, or more).

Introduction of gases to a gaseous atmosphere can occur at any suitable rate. In some embodiments, any gas present during the reaction may be introduced to the gaseous atmosphere at a rate greater than or equal to 0.01 sccm, greater than or equal to 0.1 sccm, greater than or equal to 1 sccm, greater than or equal to 5 sccm, greater than or equal to 10 sccm, greater than or equal to 25 sccm, greater than or equal to 50 sccm, greater than or equal to 100 sccm, greater than or equal to 150 sccm, greater than or equal to 500 sccm, or greater than or equal to 1000 sccm. Any gas present during the reaction may be introduced to the gaseous atmosphere at a rate less than or equal to 1500 sccm, less than or equal to 1000 sccm, less than or equal to 500 sccm, less than or equal to 150 sccm, less than or equal to 100 sccm, less than or equal to 50 sccm, less than or equal to 25 sccm, less than or equal to 10 sccm, less than or equal to 5 sccm, less than or equal to 1 sccm, or less than or equal to 0.1 sccm. Combinations of the above-referenced ranges are also possible (e.g., greater than or equal to 10 sccm and less than or equal to 25 sccm). Other ranges are also possible. If more than one gas is introduced, the gases may be introduced at the same rate or they may be introduced at different rates. Gases may be introduced at the same time or at different times. The gases may be introduced in any order (e.g., the nanostructure precursor may be introduced prior to the introduction of any other gas, may be introduced after all other gases have been introduced, or may be introduced before some gases but after others).

In some cases, exposure occurs at pressures comprising substantially atmospheric pressure (i.e., about 1 atm or 760 torr). In some cases, exposure occurs at a pressure of less than 1 atm (e.g., less than 100 torr, less than 10 torr, less than 1 torr, less than 0.1 torr, less than 0.01 torr, or lower). In some cases, the use of high pressure may be advantageous. For example, in some embodiments, exposure to a set of conditions comprises exposure at a pressure of at least 2 atm, at least 5 atm, at least 10 atm, at least 25 atm, or at least 50 atm.

The carbon-based nanostructures may grow from the nanostructure precursor at any suitable rate. In some embodiments, the carbon-based nanostructures may grow from the nanostructure precursor such that lengths of carbon-based nanostructures increase at a rate of greater than or equal to 0.1 microns per minute, greater than or equal to 0.25 microns per minute, greater than or equal to 0.5 microns per minute, greater than or equal to 1 micron per minute, greater than or equal to 2.5 microns per minute, or greater than or equal to 5 microns per minute. In some embodiments, the carbon-based nanostructures may grow from the nanostructure precursor such that lengths of carbon-based nanostructures increase at a rate of up to 10 microns per minute, up to 50 microns per minute, up to 100 microns per minute, or more. Combinations of the above-referenced ranges are also possible (e.g., greater than or equal to 0.1 microns per minute and up to 100 microns per minute). Other ranges are also possible.

The carbon-based nanostructures may grow from the nanostructure precursors for any amount of time. In certain embodiments, the growth may occur over a time period of greater than or equal to 1 minute, greater than or equal to 2 minutes, greater than or equal to 5 minutes, greater than or equal to 10 minutes, greater than or equal to 15 minutes, greater than or equal to 30 minutes, or greater than or equal to 60 minutes. The growth may occur over a period of less than or equal to 90 minutes, less than or equal to 60 minutes, less than or equal to 30 minutes, less than or equal to 15 minutes, less than or equal to 10 minutes, less than or equal to 5 minutes, or less than or equal to 2 minutes. Combinations of the above-referenced ranges are also possible (e.g., greater than or equal to 5 minutes and less than or equal to 15 minutes). Other ranges are also possible.

Generally, materials which are in direct contact with each other are directly adjacent to each other with no intervening material.

First and second articles that are in indirect contact with each other have one or more intermediate materials between them, and a pathway can be drawn from the first article to the second article which pathway does not traverse a gas.

First and second articles that are in indirect solid contact with each other have one or more intermediate solid materials between them, and a pathway can be drawn from the first article to the second article which pathway travels only through solid material(s).

In certain embodiments, formation and/or growth occurs from a nanoscale feature that is supported by a substrate. The substrate can be a single material or it may be a composite substrate that includes more than one component. A variety of growth substrates may be used in accordance with certain of the systems and methods described herein. Growth substrates may comprise any material capable of supporting the nanoscale feature and/or the carbon-based nanostructures that are grown. The growth substrate may be selected to be inert to and/or stable under sets of conditions used in a particular process, such as nanostructure growth conditions, nanostructure removal conditions, and the like. In some cases, the growth substrate comprises a substantially flat surface. In some cases, the growth substrate comprises a substantially nonplanar surface. For example, the growth substrate may comprise a cylindrical surface.

In some embodiments, the substrate may be a solid. According to certain embodiments, the solid may be a single phase material such as a metal. The solid may be a composite, in some embodiments. In certain embodiments, the solid may be in any state of crystallinity including single crystalline, polycrystalline, semicrystalline, and/or amorphous.

According to certain embodiments, the substrate (or a component of a composite substrate) can be sensitive to elevated temperatures. For example, in some embodiments, the substrate (or a component of a composite substrate) can undergo a phase change or a substantial loss of mass when heated to relatively low temperatures. One advantage of certain (although not necessarily all) embodiments is that carbon-based nanostructures can be grown at relatively low temperatures, which can allow for the growth of carbon-based nanostructures on substrates that were believed to be too temperature-sensitive to support carbon-based nanostructure growth without changing phase or degrading.

As used herein, metal elements are those found in Groups 1-12 of the Periodic Table (except hydrogen (H)); Al, Ga, In, Tl, and Nh in Group 13 of the Periodic Table; Sn, Pb, and Fl in Group 14 of the Periodic Table; Bi and Mc in Group 15 of the Periodic Table; Po and Lv in Group 16 of the Periodic Table; the lanthanides; and the actinides.

As used herein, metalloid elements are boron (B), silicon (Si), germanium (Ge), arsenic (As), antimony (Sb), tellurium (Te), and Astatine (At).

As used herein, non-metal elements are hydrogen (H), carbon (C), nitrogen (N), phosphorous (P), oxygen (O), sulfur (S), selenium (Se), fluorine (F), chlorine (Cl), bromine (Br), iodine (I), helium (He), neon (Ne), argon (Ar), krypton (Kr), xenon (Xe), radon (Rn), and oganesson (Og).

As noted above, certain embodiments comprise use or addition of one or more support materials. The support materials may provide mechanical, chemical, or otherwise stabilizing support for the plurality of nanostructures. In some cases, the support material may be a monomer, a polymer, a fiber, a ceramic, or a metal, and may be further processed to support the nanostructures. For example, a mixture of monomeric species may be added to the elongated nanostructures, and subsequent polymerization of the monomeric species may produce a polymer matrix comprising the elongated nanostructures disposed therein. As another example, a solgel can be applied to a collection of elongated nanostructures and processed to form a ceramic material between the elongated nanostructures. In some embodiments, gas phase infiltration can be used to form carbonaceous material or silicon carbide between the elongated nanostructures. Gas-phase infiltration may be executed by various processes such as chemical vapor deposition including decomposition of hydrocarbons. Examples of suitable support materials are described in detail below.

The support material may be a polymer material (e.g., an organic polymer material), a metal material, a ceramic material, or combinations thereof. Polymer materials for use as binding materials and/or support materials, as described herein, may be any material compatible with elongated nanostructures. For example, the polymer material may be selected to uniformly "wet" the elongated nanostructures and/or to bind one or more substrates. In some cases, the polymer material may be selected to have a particular viscosity, such as 50,000 cPs or lower; 10,000 cPs or lower; 5,000 cPs or lower; 1,000 cPs or lower; 500 cPs or lower; 250 cPs or lower; or 100 cPs or lower. In some embodiments, the polymer material may be selected to have a viscosity between 150-250 cPs. In some cases, the support material may comprise a thermoset or thermoplastic. Non-limiting examples of thermosets include Microchem SU-8 (UV curing epoxy, grades from 2000.1 to 2100, and viscosities ranging from 3 cPs to 10,000 cPs), Buehler Epothin (low viscosity, about 150 cPs, room temperature curing epoxy), West Systems 206+109 Hardener (low viscosity, ~200 cPs, room temperature curing epoxy), Loctite Hysol 1C (20-min curing conductive epoxy, viscosity 200,000-500,000 cPs), Hexcel RTM6 (resin transfer molding epoxy, viscosity during process ~10 cPs), Hexcel HexFlow VRM 34 (structural VAR™ or vacuum assisted resin transfer molding epoxy, viscosity during process ~500 cPs). Non-limiting examples of thermoplastics include polystyrene, or Microchem PMMA (UV curing thermoplastic, grades ranging from 10 cPs to ~1,000 cPs). In one embodiment, the polymer support material may be PMMA, EpoThin, West-Systems EPON, M21 resin, Cycom 5320, 8552 resin, RTM6, VRM34, 977-3, SU8, or Hysol1C.

The support material (or a precursor thereof) may be transported between the elongated nanostructures via any method known to those of ordinary skill in the art. In some embodiments, the support material may be transported between the elongated nanostructures via capillary forces. In other embodiments, the support material or precursor thereof may be transported between the elongated nanostructures by pressure driven flow, molding, or any other known technique.

The support material may be hardened using any suitable method. In some embodiments in which epoxy is used as a support material, the epoxy may be cured, for example, by allowing the precursor material to set, or optionally by applying heat. In some embodiments, hardening may comprise the polymerization of the support material precursor. In some embodiments, hardening the support material may comprise cooling the support material such that it changes phase from a liquid to a solid (i.e., "freezes") or becomes less compliant.

In some embodiments, the article comprising the substrate (e.g., copper metal and/or alloy substrate) and the elongated carbon-based nanostructures is part of a polymer composite. For example, in some embodiments, a support material can be added to the carbon-based nanostructures, as described above. In some embodiments, the elongated carbon-based nanostructures can be mated with an article comprising a support material, for example, by softening the support material, bringing the carbon-based nanostructures into contact with the softened support material, and allowing the softened support material to infiltrate the interstices between the elongated nanostructures. The support material may, according to some embodiments, be subsequently cured or otherwise hardened to form a composite article. According to certain embodiments, the composite article can be metal/graphite fiber-metal hybrid laminate (e.g., where metal foils are placed as layers within polymer-containing composites). In some embodiments, the composite article comprises copper-containing wires and/or mesh. Such articles can be used, for example, for mitigating electrostatic discharge and/or lightning strikes. In some embodiments, the article is part of glass-reinforced (GLARE) composite and/or a fiber metal hybrid laminate (FMHL).

In some embodiments, the article comprising the copper-containing substrate and the elongated carbon-based nanostructures can be a part of and/or further comprise a prepreg. As used herein, the term "prepreg" refers to one or more layers of polymeric material (e.g., thermoset or thermoplastic resin) containing embedded fibers. The embedded fibers in the prepreg can be, for example, fibers of carbon, metal, glass, and/or silicon carbide. In certain embodiments, the fibers of the prepreg are electronically conductive.

As used herein, a "nanoscale feature" refers to a feature, such as a protrusion, groove or indentation, particle, or other measurable geometric feature on an article that has at least one cross-sectional dimension of less than 1 micron. In some cases, the nanoscale feature may have at least one cross-sectional dimension of less than 500 nm, less than 250 nm, less than 100 nm, less than 10 nm, less than 5 nm, less than 3 nm, less than 2 nm, less than 1 nm, between 0.3 and 10 nm, between 10 nm and 100 nm, or between 100 nm and 1 micron. Without wishing to be bound by any particular theory, "nanoscale features" of the substrate may catalyze the nanostructure formation. Not wishing to be bound by any theory, the nanoscale feature may increase the rate at which a reaction, nucleation step, or other process involved in the formation of a nanostructure occurs. Nanoscale features can be formed, for example, by roughening the surface of an active growth material, or a precursor thereof.

U.S. Provisional Application No. 62/780,125, filed Dec. 14, 2018, and entitled "Formation and/or Growth of Carbon-Based Nanostructures on Metallic Substrates, Including Copper-Containing Substrates, and Related Systems and Methods" is incorporated herein by reference in its entirety for all purposes.

The following example is intended to illustrate certain embodiments of the present invention, but does not exemplify the full scope of the invention.

EXAMPLE

This example describes the formation and growth of elongated carbon-based nanostructures on copper-containing substrates.

The following materials were used as copper-containing substrates: a copper wire, a copper transmission electronic microscopy (TEM) grid, and a copper film on a wafer. The copper surfaces of the copper substrates were roughened by polishing, $O_2$ plasma exposure, and CuO reduction at 200° C., and/or high temperature (e.g., 1000° C.) treatment on Argon. The copper surfaces were then treated with a base (e.g., NaOH, KOH, and/or $Na_2CO_3$) to convert them to CuO/CuOH.

Solid, elongated carbon-based nanostructures (which included carbon nanofibers and likely carbon nanotubes) were grown on the copper substrates by chemical vapor deposition. Argon was used as the carrier gas and $C_2H_2$ was used as the carbon precursor. It was determined that the use of $H_2$ increased the yield. Without wishing to be bound by any particular theory, it is believed that the $H_2$ exposure results in the reduction of the CuO and/or CuOH to metallic Cu. Temperatures at or between 300° C. and 780° C. were used. Baseline growth was typically done at 400° C. The diameters of the carbon-based nanostructures ranged from 20 nm to 1 μm.

Figure 2:
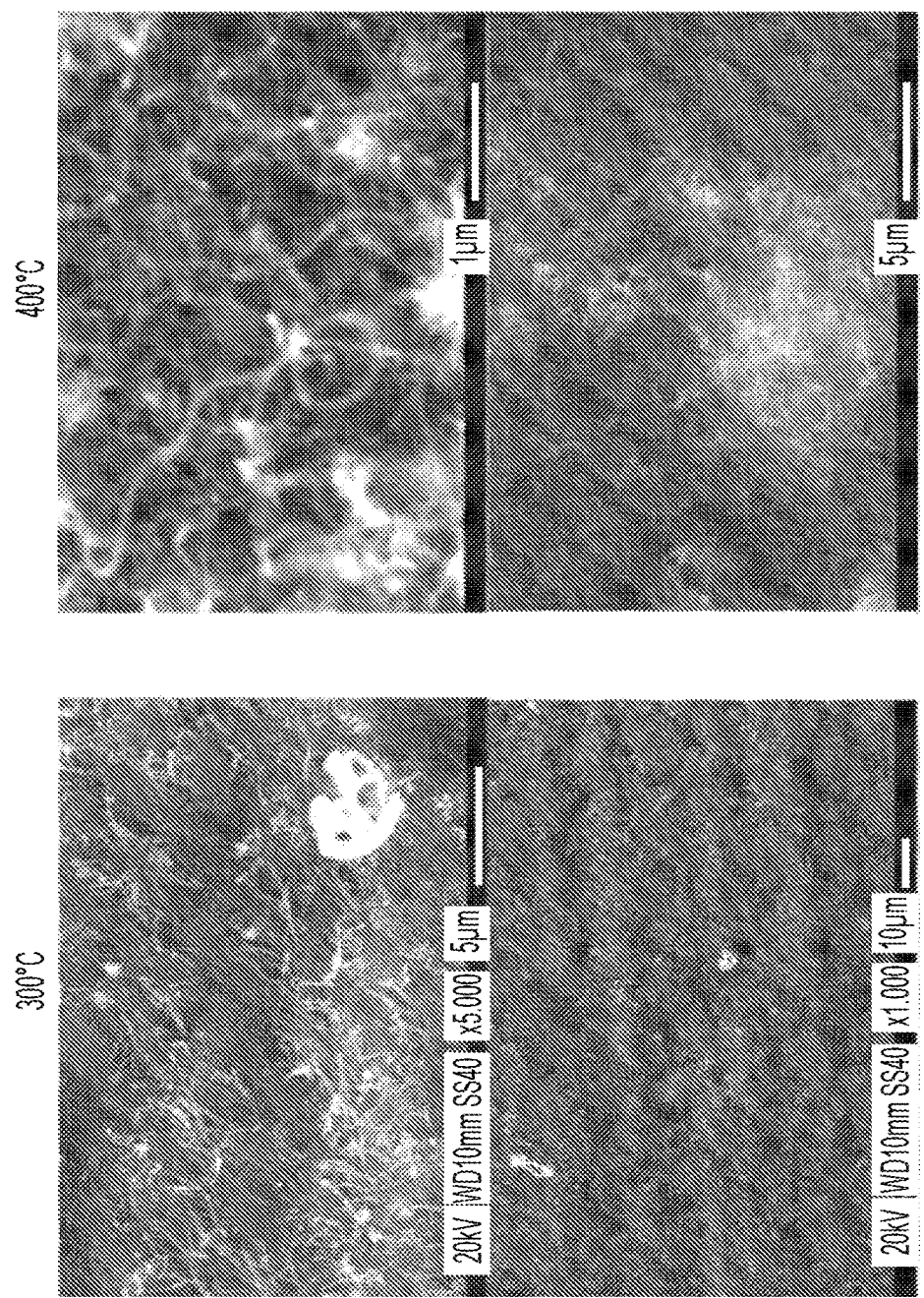
FIG. 2 shows scanning electron microscope (SEM) images of elongated carbon-based nanostructures grown at 300° C. and 400° C., in accordance with certain embodiments.

FIG. 2 shows scanning electron microscope (SEM) images of elongated carbon-based nanostructures grown at 300° C. and 400° C. on a copper layer using the process outlined above. NaOH was used as the base.

Figure 3:
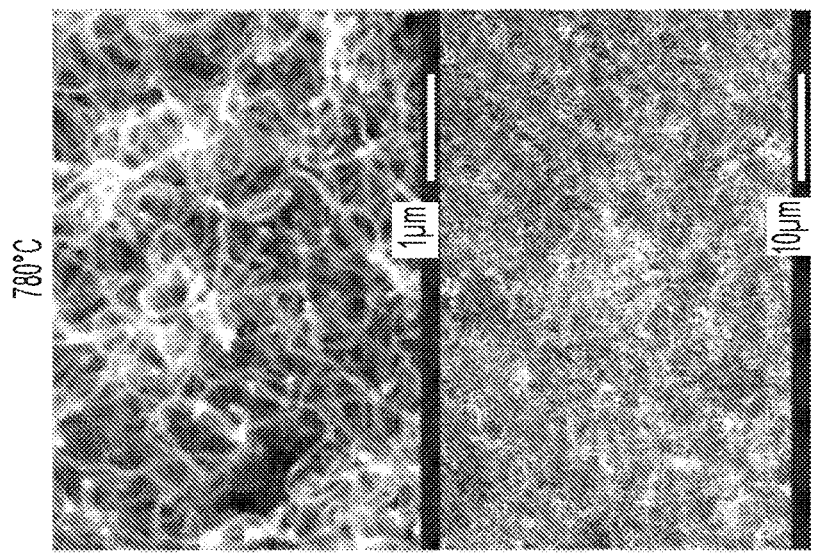
FIG. 3 shows SEM images of elongated carbon-based nanostructures grown at 480° C. and 780° C., in accordance with certain embodiments.
Figure 3:
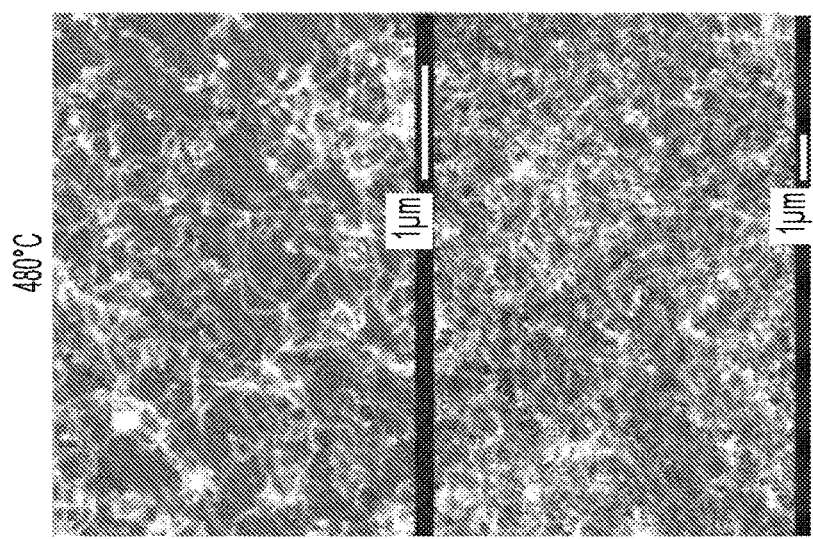

FIG. 3 shows SEM images of elongated carbon-based nanostructures grown at 480° C. and 780° C. on a copper layer using the process outlined above. NaOH was used as the base.

Figure 4:
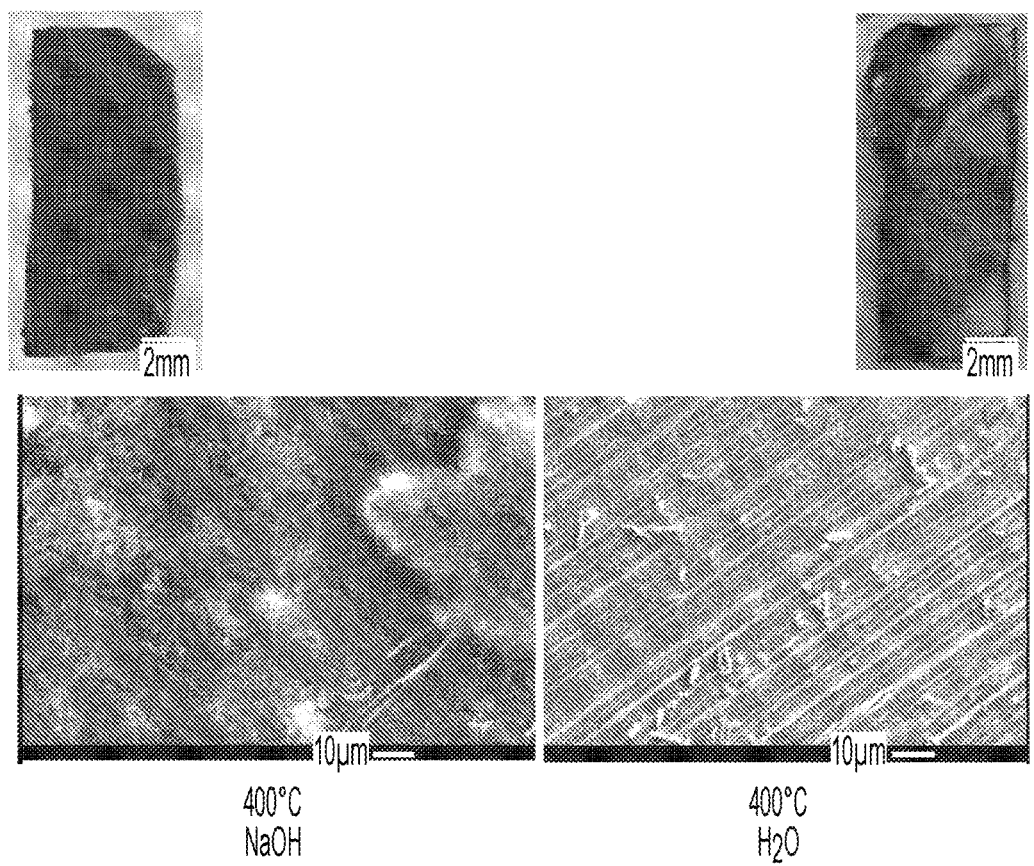
FIG. 4 includes optical and SEM images of elongated carbon-based nanostructures grown at 400° C. wherein the at least one agent comprised NaOH, compared to elongated carbon-based nanostructures grown at 400° C. wherein the at least one agent comprised water. The latter did not display significant growth of elongated carbon-based nanostructures (i.e., there are bare μm-size areas with no elongated carbon-based nanostructures). In contrast, the former had significant growth of elongated carbon-based nanostructures throughout the surface.

FIG. 4 includes optical and SEM images of elongated carbon-based nanostructures grown at 400° C. on copper layers. The left image shows growth achieved when NaOH was used to activate the copper surface, and the right image shows the growth achieved when only water was used during a control activation step. The process in which water was employed did not display significant growth of elongated carbon-based nanostructures (i.e., there were bare μm-size areas with no elongated carbon-based nanostructures). In contrast, the process that used NaOH yielded significant growth of elongated carbon-based nanostructures throughout the surface.

Figure 5A:
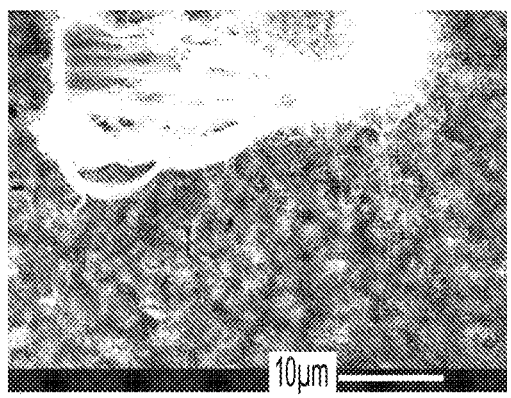
FIGS. 5A-5D are SEM images demonstrating a growth process on various forms of copper substrates, in accordance with certain embodiments.
Figure 5B:
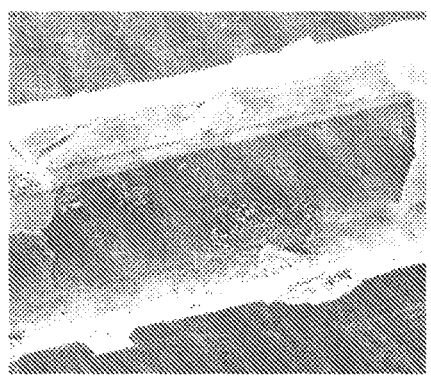
Figure 5C:
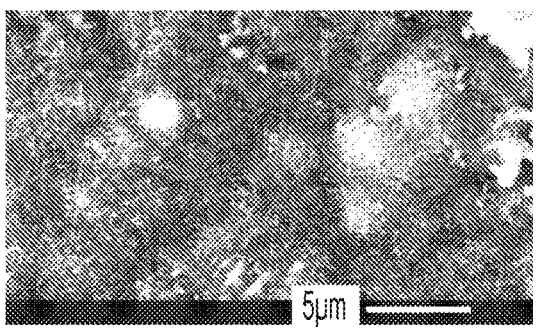
Figure 5D:
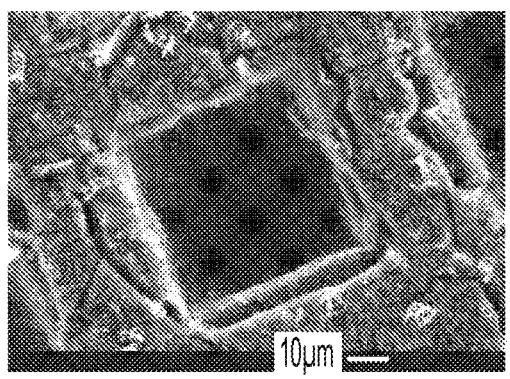

FIGS. 5A-5D are photographs demonstrating a growth process on various forms of copper substrates, in accordance with certain embodiments. FIG. 5A shows elongated carbon-based nanostructure growth on a copper film on a wafer. FIGS. 5B and 5C show elongated carbon-based nanostructure growth on a fiber. FIG. 5D shows elongated carbon-based nanostructure growth on a copper TEM grid. In all cases, the substrates were exposed to NaOH prior to the growth of the elongated carbon-based nanostructures.

Figure 6A:
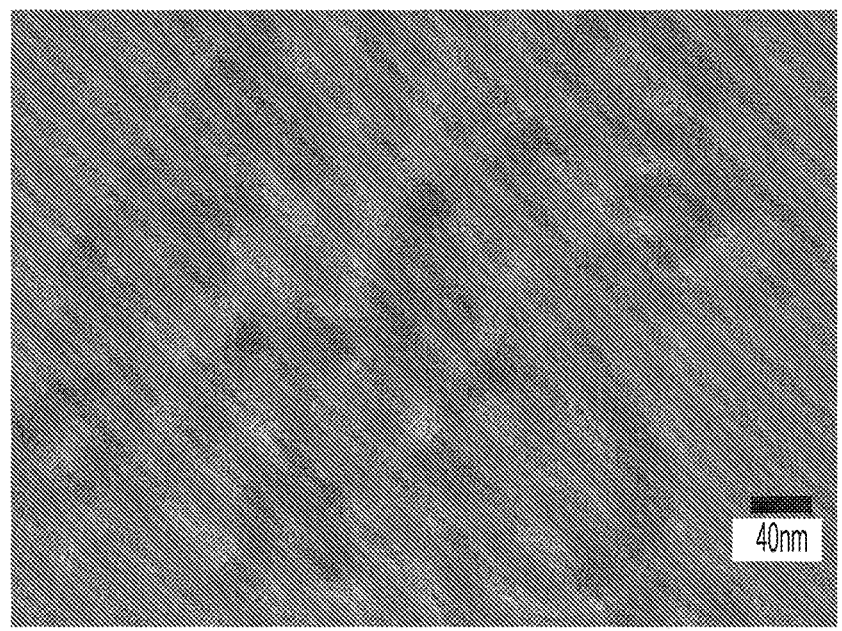
FIGS. 6A-6B are TEM images of elongated carbon-based nanostructures, in accordance with certain embodiments.
Figure 6B:
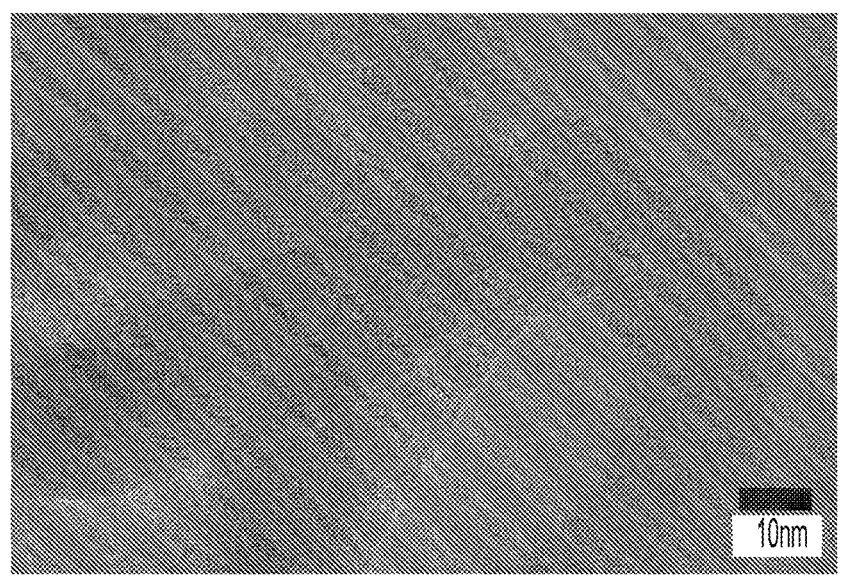

FIGS. 6A-6B are TEM images of elongated carbon-based nanostructures grown on copper layers using the process outlined above. The substrates were exposed to NaOH prior to the growth of the elongated carbon-based nanostructures.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method, comprising:
    exposing a substrate comprising a metal and/or metal alloy region comprising copper to at least one agent such that the at least one agent chemically and/or physically modifies the substrate; and
    exposing the substrate to conditions causing the formation and/or growth of cylindrical and/or pseudo-cylindrical elongated carbon-based nanostructures directly on metallic copper of the substrate;
    wherein the exposing the substrate to the at least one agent comprises removing metal from the metal and/or metal alloy region to alter a surface roughness of the metal and/or metal alloy region.

2. The method of claim 1, wherein the metallic copper of the substrate on which the carbon-based nanostructure is directly formed and/or grown is part of a metallic portion having at least one cross-sectional dimension of at least about 1 mm.

3. A method, comprising:
    exposing a substrate comprising a metal and/or metal alloy region comprising copper to at least one agent such that the at least one agent chemically and/or physically modifies the substrate; and
    exposing the substrate to conditions causing the formation and/or growth of cylindrical and/or pseudo-cylindrical elongated carbon-based nanostructures directly on metallic copper of the substrate;
    wherein exposing the substrate to the at least one agent comprises changing an oxidation state of copper in the substrate.

4. The method of claim 3, wherein exposing the substrate to the at least one agent comprises oxidizing copper in the substrate.

5. The method of claim 4, wherein exposing the substrate to the at least one agent comprises reducing the oxidized copper prior to the formation and/or growth of carbon-based nanostructures directly on the copper.

6. The method of claim 1, wherein the exposing the substrate to the at least one agent comprises removing metallic copper from the metal and/or metal alloy region to alter a surface roughness of the metal and/or metal alloy region.

7. A method, comprising:
exposing a substrate comprising a metal and/or metal alloy region comprising copper to at least one agent such that the at least one agent chemically and/or physically modifies the substrate; and
exposing the substrate to conditions causing the formation and/or growth of cylindrical and/or pseudo-cylindrical elongated carbon-based nanostructures directly on metallic copper of the substrate;
wherein exposing the substrate to the at least one agent comprises removing oxidized copper from the substrate.

8. The method of claim 1, wherein a single agent is used (1) to remove at least a portion of oxidized copper from the substrate and/or change an oxidation state of copper in the substrate and (2) to remove metal from the metal and/or metal alloy region to alter surface roughness of the metal and/or metal alloy region.

9. The method of claim 1, wherein altering a surface roughness of the metal and/or metal alloy region comprises increasing the surface roughness of the metal and/or metal alloy region.

10. The method of claim 6, wherein altering a surface roughness of the metal and/or metal alloy region comprises increasing the surface roughness of the metal and/or metal alloy region.

11. The method of claim 8, wherein altering a surface roughness of the metal and/or metal alloy region comprises increasing the surface roughness of the metal and/or metal alloy region.

12. The method of claim 1, wherein altering a surface roughness of the metal and/or metal alloy region comprises increasing a RMS surface roughness of the metal and/or metal alloy region to between 10 nm and 500 nm.

13. The method of claim 6, wherein altering a surface roughness of the metal and/or metal alloy region comprises increasing a RMS surface roughness of the metal and/or metal alloy region to between 10 nm and 500 nm.

14. The method of claim 8, wherein altering a surface roughness of the metal and/or metal alloy region comprises increasing a RMS surface roughness of the metal and/or metal alloy region to between 10 nm and 500 nm.

15. The method of claim 1, wherein the carbon-based nanostructures comprise carbon nanotubes, carbon nanowires, and/or carbon nanofibers.

16. The method of claim 1, wherein the carbon-based nanostructures comprise carbon nanotubes.

17. The method of claim 3, wherein the metallic copper of the substrate on which the carbon-based nanostructure is directly formed and/or grown is part of a metallic portion having at least one cross-sectional dimension of at least about 1 mm.

18. The method of claim 3, wherein the carbon-based nanostructures comprise carbon nanotubes, carbon nanowires, and/or carbon nanofibers.

19. The method of claim 3, wherein the carbon-based nanostructures comprise carbon nanotubes.

20. The method of claim 7, wherein the carbon-based nanostructures comprise carbon nanotubes.

* * * * *